US012593681B2

(12) United States Patent
Chen et al.

(10) Patent No.: US 12,593,681 B2
(45) Date of Patent: Mar. 31, 2026

(54) SEMICONDUCTOR DEVICE INCLUDING DIELECTRICS MADE OF POROUS ORGANIC FRAMEWORKS, AND METHOD OF FABRICATING THE SAME

(71) Applicant: Taiwan Semiconductor Manufacturing Company, Ltd., Hsinchu (TW)

(72) Inventors: Szu-Hua Chen, Tainan City (TW); Wei-Yen Woon, Taoyuan City (TW); Szuya Liao, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 962 days.

(21) Appl. No.: 17/839,447

(22) Filed: Jun. 13, 2022

(65) Prior Publication Data

US 2023/0402386 A1 Dec. 14, 2023

(51) Int. Cl.

| | |
|---|---|
| ***H01L 23/532*** | (2006.01) |
| ***C07F 5/02*** | (2006.01) |
| ***H01L 21/768*** | (2006.01) |
| ***H01L 23/522*** | (2006.01) |

(52) U.S. Cl.

CPC .......... *H01L 23/53295* (2013.01); *C07F 5/02* (2013.01); *H01L 21/76802* (2013.01); *H01L 21/76832* (2013.01); *H01L 23/5226* (2013.01)

(58) Field of Classification Search

None

See application file for complete search history.

(56) References Cited

U.S. PATENT DOCUMENTS

| | | | | |
|---|---|---|---|---|
| 2006/0214303 A1* | 9/2006 | Goodner | ............. | H01L 23/5329 257/E23.077 |
| 2018/0308793 A1* | 10/2018 | Lin | ..................... | H01L 21/0234 |
| 2024/0092809 A1* | 3/2024 | Evans | ..................... | C07F 5/025 |

* cited by examiner

*Primary Examiner* — Tae H Yoon

(74) *Attorney, Agent, or Firm* — JCIPRNET

(57) ABSTRACT

A semiconductor device includes a substrate and an interconnection layer disposed on the substrate. The interconnection layer includes a plurality of etch-stop layers, a plurality of first dielectric layers, and a plurality of conductive layers. The first dielectric layers are disposed on the plurality of etch-stop layers, wherein the plurality of first dielectric layers comprises porous organic framework (POF) dielectrics having a dielectric constant of 2 or less, and a thermal conductivity of 1 W/(m·K) or more. The conductive layers are embedded in the first dielectric layers.

20 Claims, 21 Drawing Sheets

BDA

TAM

COF-300

SEMICONDUCTOR DEVICE INCLUDING DIELECTRICS MADE OF POROUS ORGANIC FRAMEWORKS, AND METHOD OF FABRICATING THE SAME

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
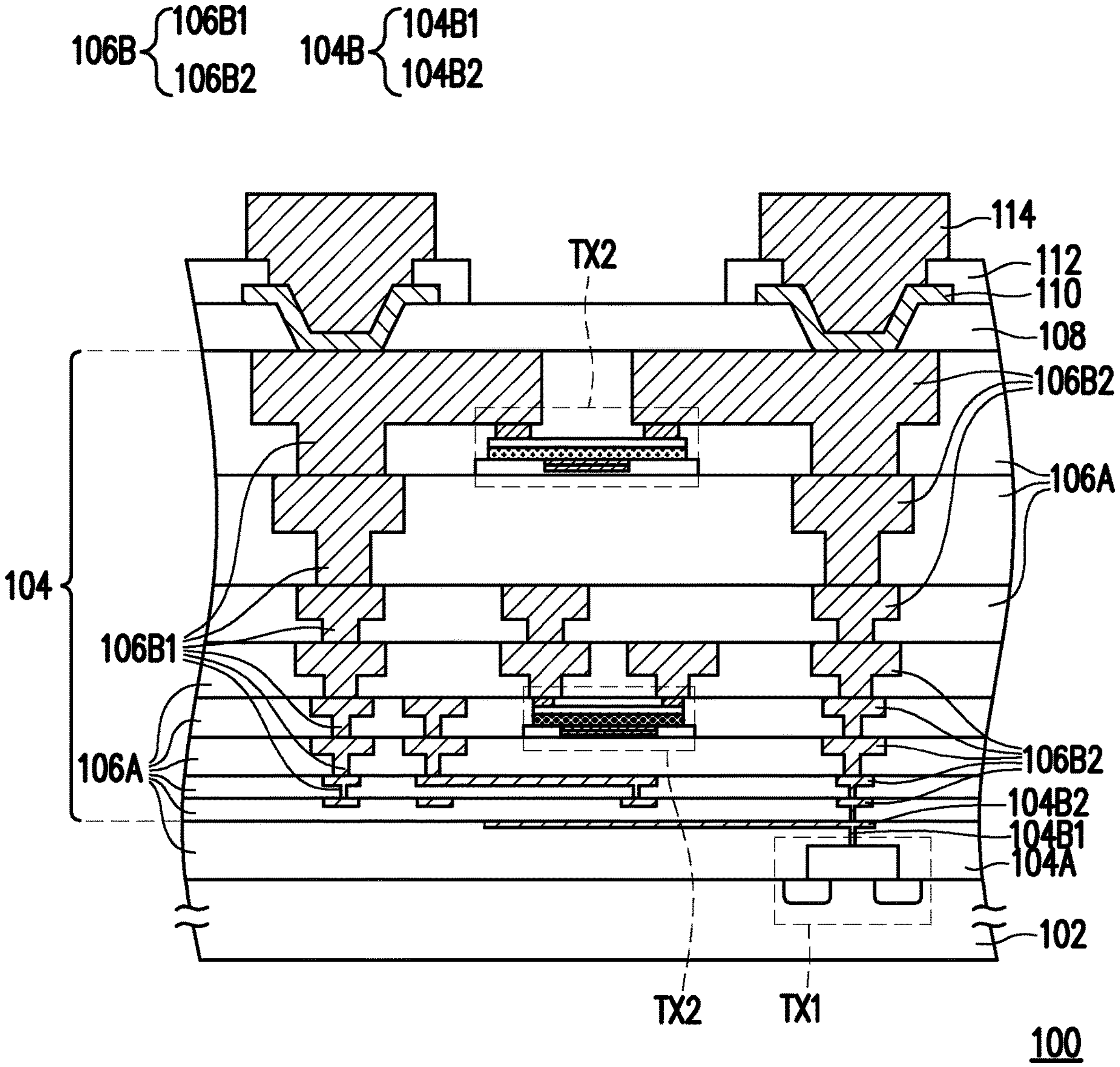
FIG. 1 is a schematic cross-sectional view of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “on”, “over”, “overlying”, “above”, “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of a semiconductor device in accordance with some embodiments of the disclosure. In some embodiments, the semiconductor device 100 includes a substrate 102, a bottom dielectric layer 104A, a bottom conductive layer 104B, an interconnection layer 106, a passivation layer 108, a post-passivation layer 112, a plurality of conductive pads 110, and a plurality of conductive terminals 114. In some embodiments, the substrate 102 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 102 may be a bulk silicon substrate, a silicon-on-insulator (SOI) substrate, or a germanium-on-insulator (GOI) substrate.

In some embodiments, the substrate 102 includes various doped regions depending on circuit requirements (e.g., p-type semiconductor substrate or n-type semiconductor substrate). In some embodiments, the doped regions are doped with p-type dopants or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a transistor TX1, which is formed over the substrate 102. Depending on the types of the dopants in the doped regions, the transistor TX1 may be referred to as n-type transistor or p-type transistor. In some embodiments, the transistor TX1 further includes a metal gate and a channel under the metal gate. The channel is located between the source region and the drain region to serve as a path for electron to travel when the transistor TX1 is turned on. On the other hand, the metal gate is located above the substrate 102 and is embedded in the bottom dielectric layer 104A.

In some embodiments, the bottom conductive layer 104B is electrically connected to the transistor TX1. For example, the bottom conductive layer 104B includes a conductive via 104B1 and a conductive pattern 104B2 embedded in the bottom dielectric layer 104A, whereby the conductive via 104B1 is connected to the transistor TX1, and the conductive pattern 104B2 is disposed on the conductive via 104B1. In certain embodiments, the conductive via 104B1 is connected to the metal gate of the transistor TX1. It should be noted that in some alternative cross-sectional views, other conductive vias 104B1 are also connected to source/drain regions of the transistor TX1. That is, in some embodiments, the conductive vias 104B1 may be referred to as “contact structures” of the transistor TX1.

In some embodiments, the transistor TX1 is formed using suitable Front-end-of-line (FEOL) process. For simplicity, one transistor TX1 is shown in FIG. 1. However, it should be understood that more than one transistor TX1 may be presented depending on the application of the semiconductor device 100. When multiple transistors TX1 are presented, these transistors TX1 may be separated by shallow trench isolation (STI; not shown) located between two adjacent transistors TX1.

As illustrated in FIG. 1, the interconnection layer 106 is formed over the substrate 102, and on the bottom dielectric layer 104A. In some embodiments, the interconnection layer 106 includes a plurality of dielectric layers 106A and a plurality of conductive layers 106B alternately stacked up along a build-up direction. In some embodiments, the conductive layers 106B include conductive vias 106B1 and conductive patterns 106B2 embedded in the dielectric layers 104A. In some embodiments, the conductive patterns 106B2 located at different level heights are connected to one another through the conductive vias 106B1. In other words, the conductive patterns 106B2 are electrically connected to one another through the conductive vias 106B1. In some embodiments, the bottommost conductive vias 106B1 are connected to the transistor TX1 through the conductive via 104B1 and the conductive pattern 104B2.

In some embodiments, the interconnection layer 106 further includes a plurality of transistors TX2 located in between the plurality of dielectric layers 106A. The transistors TX2 may be similar to the transistor TX1 described above, thus its details will not be repeated herein. The transistors TX2 may be embedded in the interconnection layer 106. For example, each transistor TX2 may be embedded in one of the dielectric layers 106A. In some embodiments, the transistors TX2 are electrically connected to the conductive layers 106B. In certain embodiments, the transistors TX2 may be arranged in an array (e.g. array of transistors/array of memory cells) in each of the dielectric layers 106A.

In some embodiments, the bottom dielectric layer 104A and the dielectric layers 106A are porous organic framework (POF) dielectrics having a dielectric constant (k value) of 2 or less, and a thermal conductivity of 1 W/(m·K) or more. Furthermore, the dielectric layers 106A have a Young's modulus of 55 GPa or more. In certain embodiments, the porous organic framework (POF) dielectrics include covalent organic framework (COF) dielectrics. In some embodiments, the dielectric layers 106A in the interconnection layer 106 are silicon-free. The details of the porous organic framework (POF) dielectrics will be explained in more detail in the later embodiments. The dielectric layers 106A may be formed by suitable fabrication techniques such as spin-on coating, chemical vapor deposition (CVD), or the like.

In some embodiments, the bottom conductive layer 104B and the conductive layers 106B include materials such as aluminum, titanium, copper, nickel, tungsten, or alloys thereof. The conductive layers 106B (including conductive patterns 106B2 and the conductive vias 106B1) may be formed by electroplating, deposition, and/or photolithography and etching. In some embodiments, the conductive patterns 106B2 and the underlying conductive vias 106B1 are formed simultaneously. It should be noted that the number of the dielectric layers 106A, the number of the conductive layers 106B illustrated in FIG. 1 are merely for illustrative purposes, and the disclosure is not limited thereto. In some alternative embodiments, fewer or more layers of the dielectric layers 106A and the conductive layers 106B may be formed depending on the circuit design.

As illustrated in FIG. 1, the passivation layer 108, the conductive pads 110, the post-passivation layer 112, and the conductive terminals 114 are sequentially formed on the interconnection layer 106. In some embodiments, the passivation layer 108 is disposed on the topmost dielectric layer 106A and the topmost conductive layer 106B (conductive pattern 106B2). In some embodiments, the passivation layer 108 has a plurality of openings partially exposing the topmost conductive patterns 106B2. In some embodiments, the passivation layer 108 is a silicon oxide layer, a silicon nitride layer, a silicon oxy-nitride layer, or a dielectric layer formed by other suitable dielectric materials. The passivation layer 108 may be formed by suitable fabrication techniques such as (high-density plasma chemical vapor deposition) HDP-CVD, (plasma-enhanced chemical vapor deposition) PECVD, or the like.

In some embodiments, the conductive pads 110 are formed over the passivation layer 108. In some embodiments, the conductive pads 110 extend into the openings of the passivation layer 108 to be in direct contact with the topmost conductive patterns 106B2. That is, the conductive pads 110 are physically and electrically connected to the interconnection layer 106. In some embodiments, the conductive pads 110 include aluminum pads, titanium pads, copper pads, nickel pads, tungsten pads, or other suitable metal pads. The conductive pads 110 may be formed by, for example, electroplating, deposition, and/or photolithography and etching. It should be noted that the number and the shape of the conductive pads 110 illustrated in FIG. 1 are merely for illustrative purposes, and the disclosure is not limited thereto. In some alternative embodiments, the number and the shape of the conductive pads 110 may be adjusted based on demand.

In some embodiments, the post-passivation layer 112 is formed over the passivation layer 108 and the conductive pads 110. In some embodiments, the post-passivation layer 112 is formed on the conductive pads 110 to protect the conductive pads 110. In some embodiments, the post-passivation layer 112 has a plurality of contact openings partially exposing each of the conductive pads 110. The post-passivation layer 112 may be a polyimide layer, a PBO layer, or a dielectric layer formed by other suitable polymers. In some embodiments, the post-passivation layer 112 is formed by suitable fabrication techniques such as HDP-CVD, PECVD, or the like.

As further illustrated in FIG. 1, the conductive terminals 114 are formed over the post-passivation layer 112 and the conductive pads 110. In some embodiments, the conductive terminals 114 extend into the contact openings of the post-passivation layer 112 to be in direct contact with the corresponding conductive pad 110. That is, the conductive terminals 114 are electrically connected to the interconnection layer 106 through the conductive pads 110. In some embodiments, the conductive terminals 114 are conductive pillars, conductive posts, conductive balls, conductive bumps, or the like. In some embodiments, a material of the conductive terminals 114 includes a variety of metals, metal alloys, or metals and mixture of other materials. For example, the conductive terminals 114 may be made of aluminum, titanium, copper, nickel, tungsten, tin, and/or alloys thereof. The conductive terminals 114 are formed by, for example, deposition, electroplating, screen printing, or other suitable methods. In some embodiments, the conductive terminals 114 are used to establish electrical connection with other components (not shown) subsequently formed or provided.

Up to here, a semiconductor device 100 in accordance with some embodiments of the present disclosure is accomplished.

As illustrated in FIG. 1, the interconnection layer 106 is formed with dielectric layers 106A that are porous organic framework (POF) dielectrics having a dielectric constant (k value) of 2 or less, and a thermal conductivity of 1 W/(m·K) or more. The formation method and the arrangement of the dielectric layers 106A will be described in more detail by referring to FIG. 2A to FIG. 2K shown below.

Figure 2A:
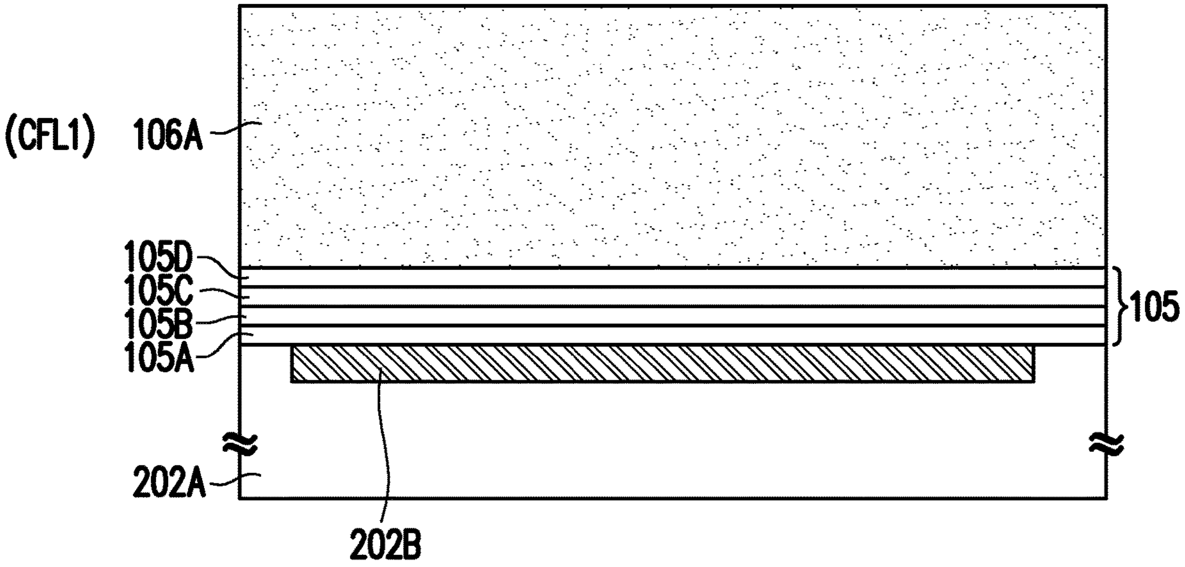
FIG. 2A to FIG. 2K are schematic cross-sectional views illustrating various stages in a method of fabricating a semiconductor device in accordance with some embodiments of the disclosure.

FIG. 2A to FIG. 2K are schematic cross-sectional views illustrating various stages in a method of fabricating a semiconductor device in accordance with some embodiments of the disclosure. FIG. 2A to FIG. 2J illustrate a portion of the interconnection layer 106 in a semiconductor device. Referring to FIG. 2A, an etch-stop layer 105 is formed over an underlying dielectric layer 202A and over an underlying conductive layer 202B. For example, the underlying dielectric layer 202A and the underlying conductive layer 202B may correspond to the bottom dielectric layer 104A and the bottom conductive layer 104B of the semiconductor device. Alternatively, the underlying dielectric layer 202A and the underlying conductive layer 202B may correspond to the dielectric layers 106A and the conductive layers 106B located at any level of the interconnection layer.

In the exemplary embodiment, the etch-stop layer 105 includes a first layer 105A, a second layer 105B disposed on the first layer 105A, a third layer 105C disposed on the second layer 105B, and a fourth layer 105D disposed on the third layer 105C. For example, in one embodiment, the first layer 105A is an aluminum nitride (AlN) layer, the second layer 105B is a silicon oxycarbide (SiOC) layer, the third layer 105C is an aluminum oxide ($AlO_x$) layer, and the fourth layer 105D is a silicon oxycarbide (SiOC) layer. However, the disclosure is not limited thereto. In some other embodiments, the etch-stop layer 105 may also include one layer, or more than one layer, which may be adjusted based on design requirements. Furthermore, when one or more layers are contained in the etch-stop layer 105, these layers may independently include AlN, $AlO_x$, silicon nitride (SiN), silicon carbide (SiC), SiOC, silicon oxynitride (SiON), silicon methylidyne (SiCH), silicon carbon nitride (SiCN), silicon oxycarbonitride (SiOCN), or the like, or combinations thereof.

As further illustrated in FIG. 2A, a dielectric layer 106A is formed over the etch-stop layer 105. In some embodiments, the dielectric layer 106A is a POF dielectric, whereby the POF dielectric is a first covalent organic framework (COF) material CFL1 (or first COF layer CFL1). For example, the first COF material CFL1 is a two-dimensional COF layer. In the exemplary embodiment, the two-dimensional COF is formed by a reaction between a first compound having a partial structure represented by formula IA and a second compound having a partial structure represented by formula IB to form a boronic ester shown in formula IC.

formula IA

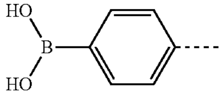

-continued formula IB

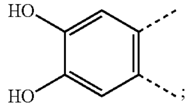

formula IC

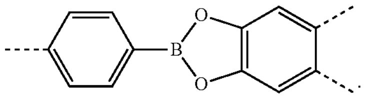

Figure 2B:
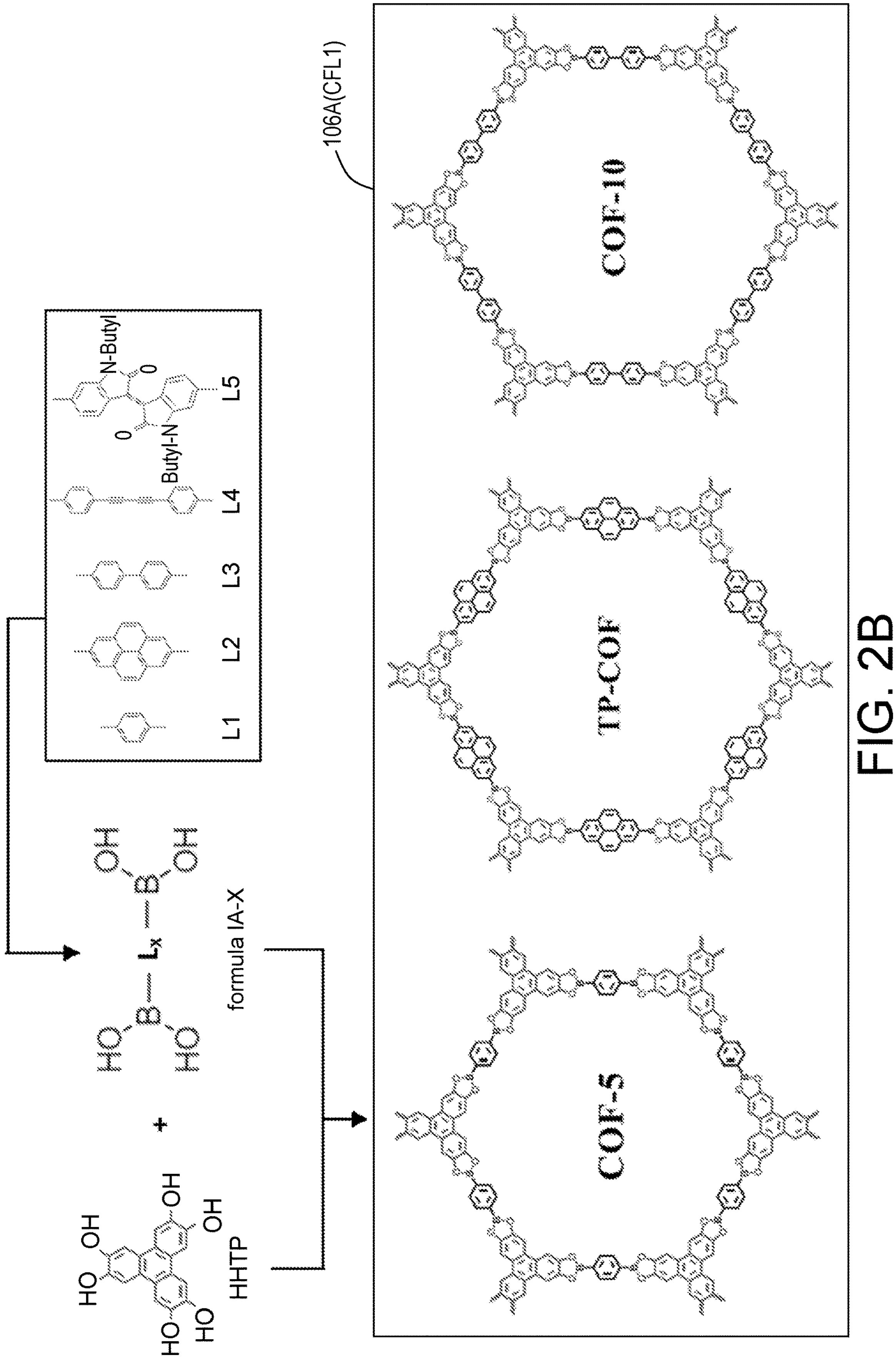

For example, referring to FIG. 2B, in some embodiments, the first compound is a compound having a structure represented by formula IA-X:

formula IA-X

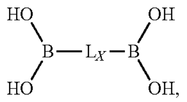

wherein in formula IA-X, $L_x$ is a linker selected from the group consisting of L1 to L5:

L1

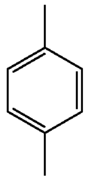

L2

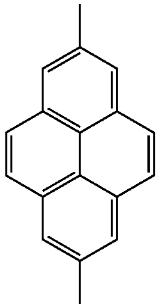

-continued

L3

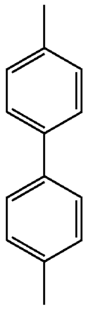

L4

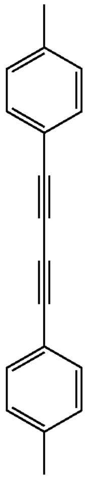

-continued

L5

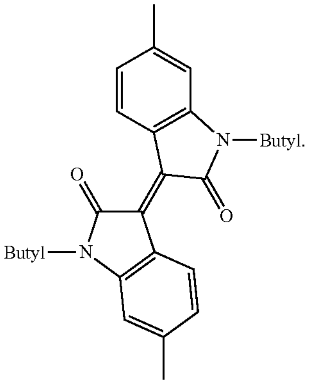

Furthermore, the second compound is for example, hexahydroxytriphenylene (HHTP).

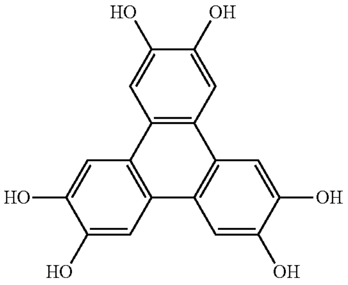

HHTP

In some embodiments, the first compound and the second compound react to form a two-dimensional building block that constitute the first covalent organic framework (COF) material CFL1 of the dielectric layer 106A. For example, in one embodiment, when the linker Lx in the first compound is L1, then a two-dimensional building block of the first covalent organic framework (COF) material CFL1 may be COF-5 having the chemical structure as shown below.

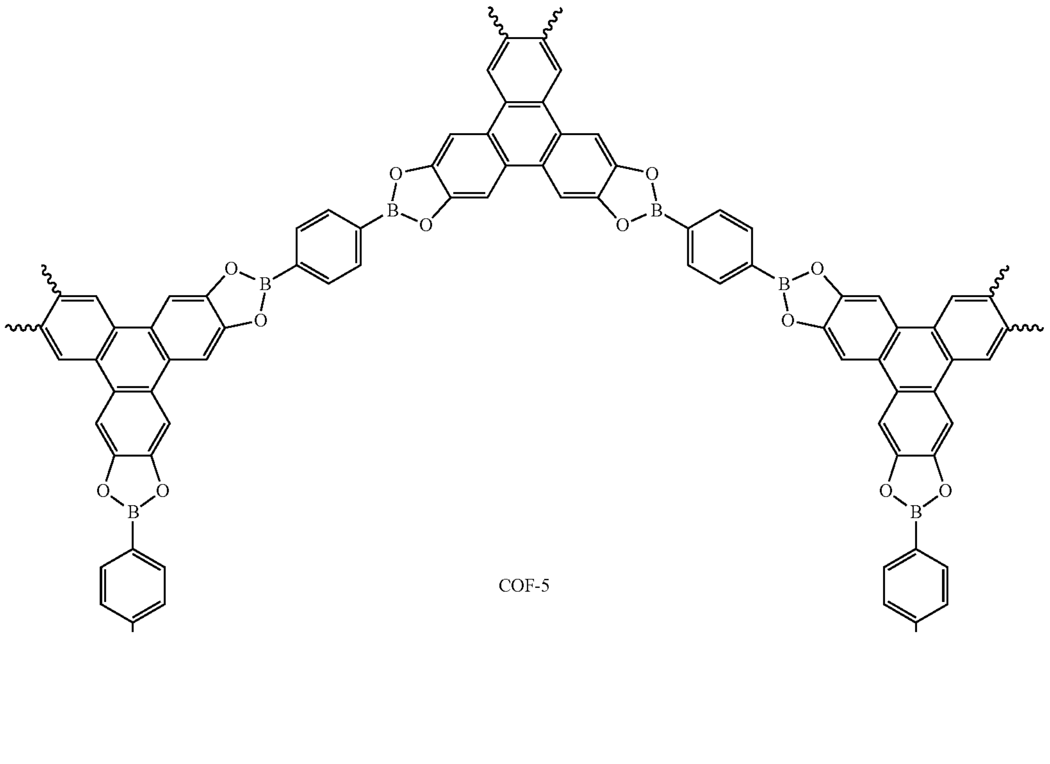

COF-5

-continued
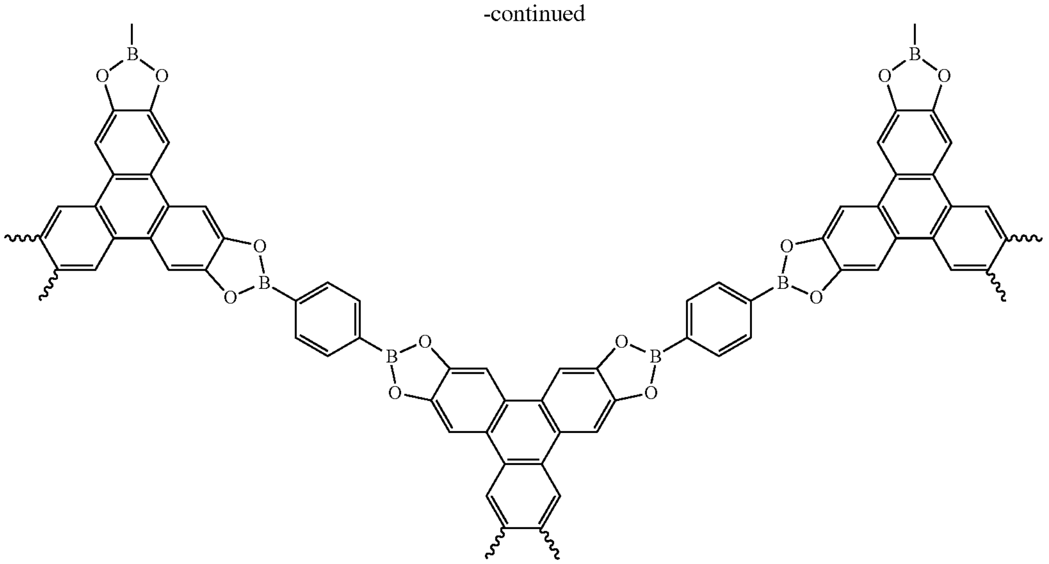
In another embodiment, when the linker Lx in the first compound is L2, then a two-dimensional building block of the first covalent organic framework (COF) material CFL1 may be TP-COF having the chemical structure as shown below.
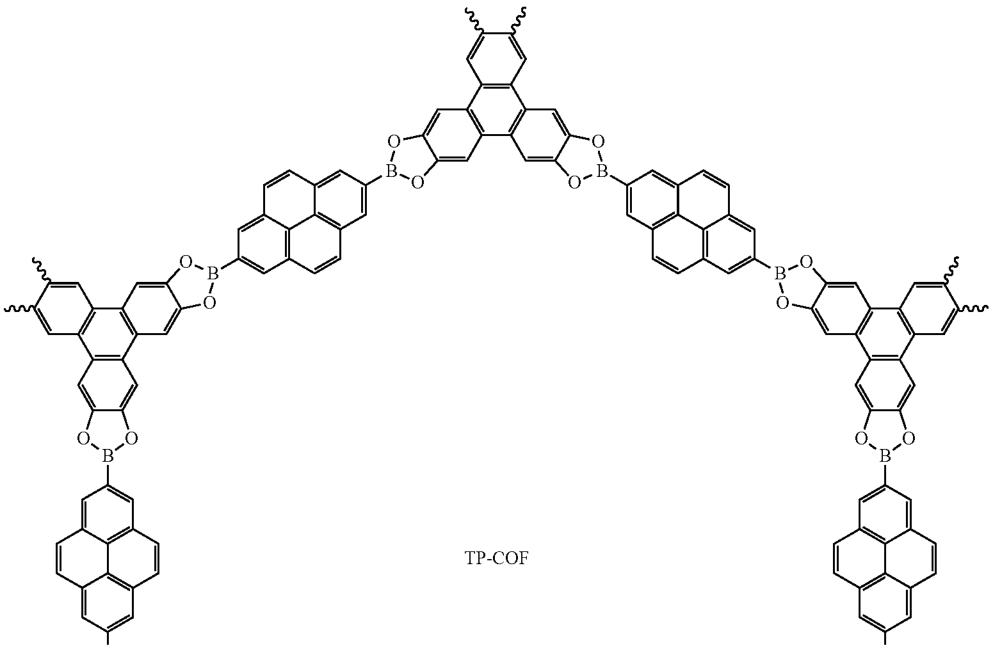
TP-COF -continued
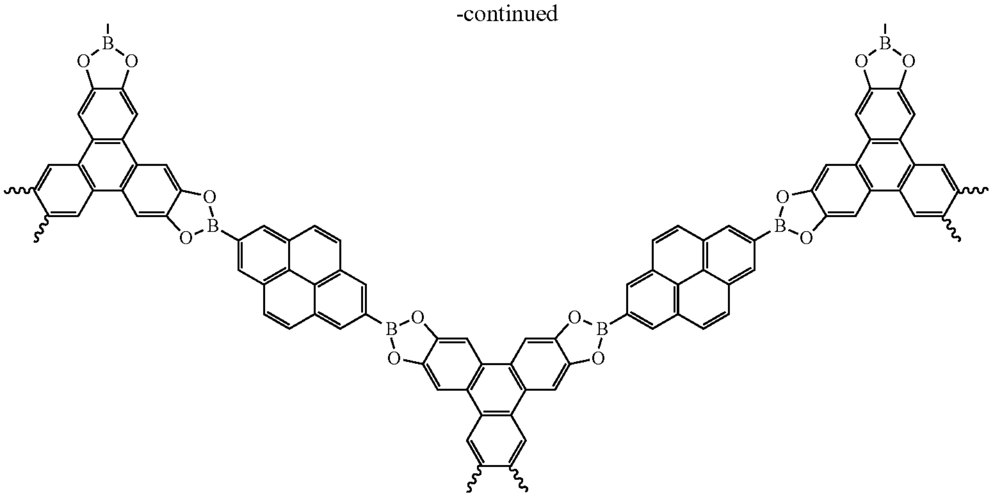
In another embodiment, when the linker Lx in the first compound is L3, then a two-dimensional building block of the first covalent organic framework (COF) material CFL1 may be COF-10 having the chemical structure as shown below.
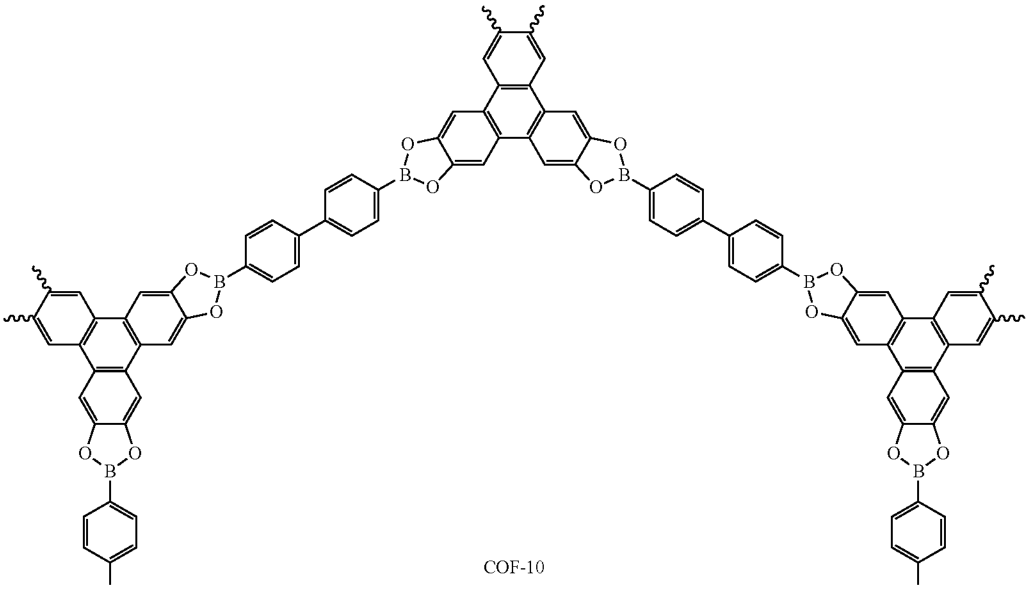
COF-10

-continued
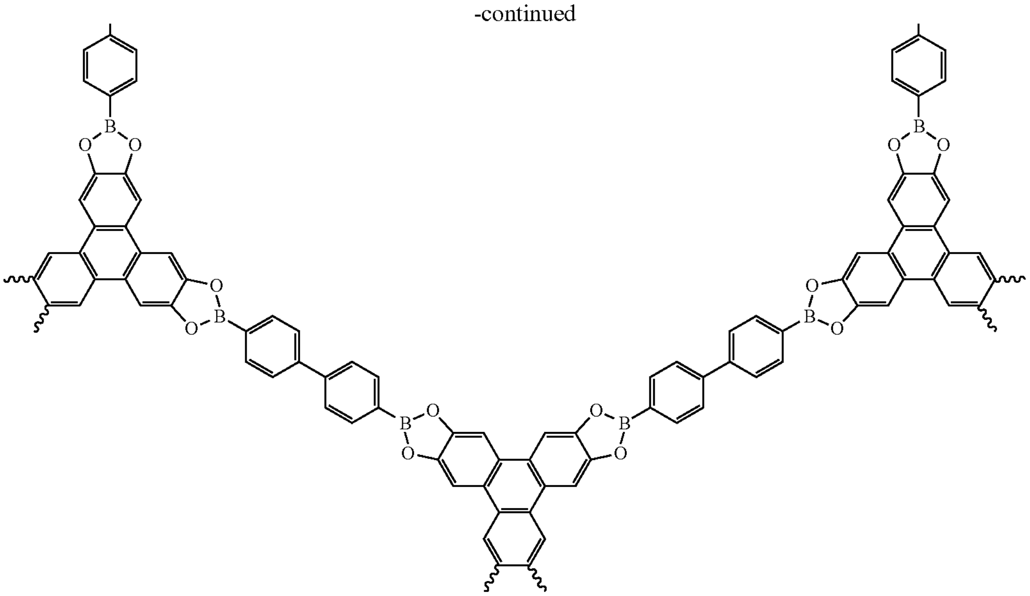
In another embodiment, when the linker Lx in the first compound is L4, then a two-dimensional building block of the first covalent organic framework (COF) material CFL1 may be COF-117 having the chemical structure as shown below (not shown in FIG. 2B).
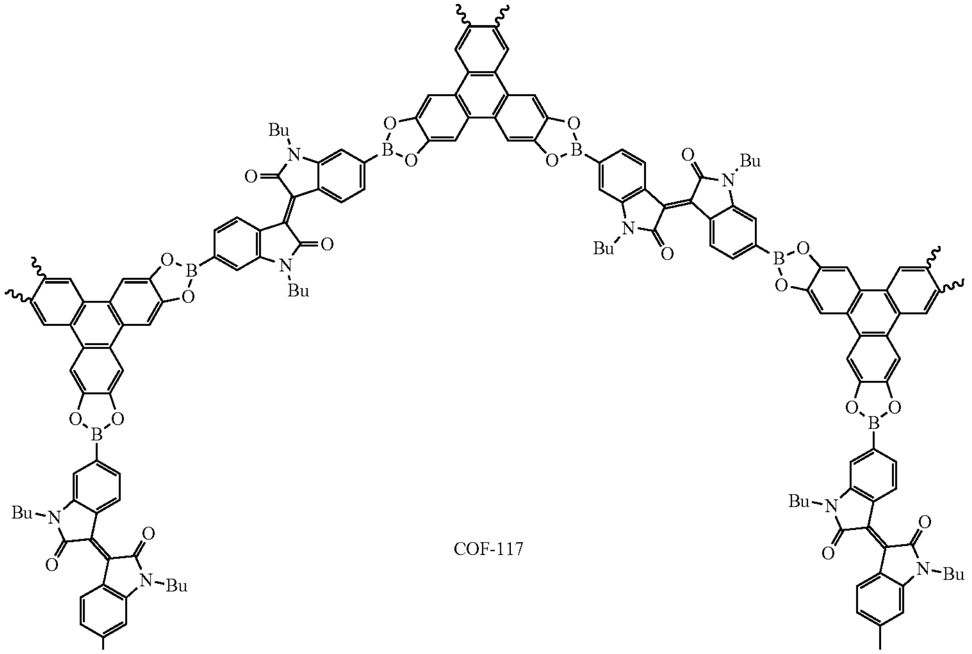
COF-117

-continued
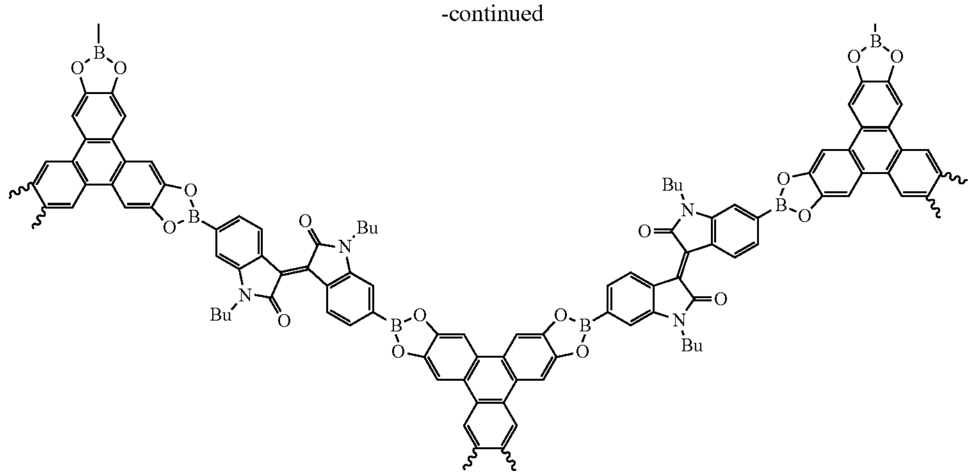
In another embodiment, when the linker Lx in the first compound is L5, then a two-dimensional building block of the first covalent organic framework (COF) material CFL1 may be DPB-COF having the chemical structure as shown below (not shown in FIG. 2B).
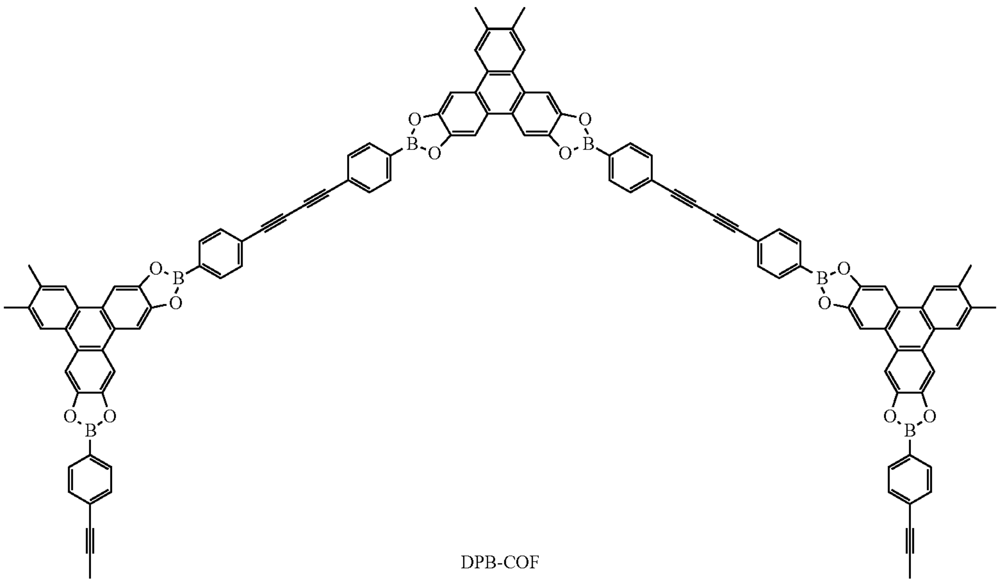
DPB-COF -continued

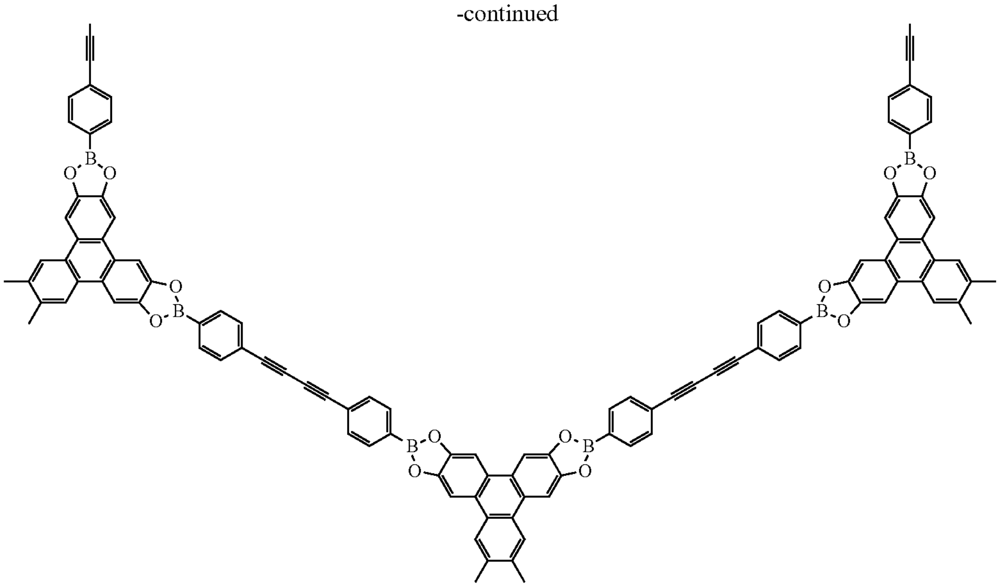

In the above embodiments, although certain linkers Lx are used in the first compound to react with the second compound to form a two-dimensional building block of the first covalent organic framework (COF) material CFL1, it is noted that other linkers may also be used. For example, other linkers selected from the group consisting of L6 to L18 may be exemplified.

L6

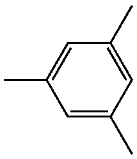

L7

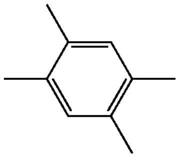

L8

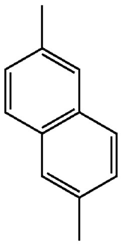

-continued

L9

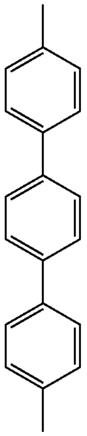

L10

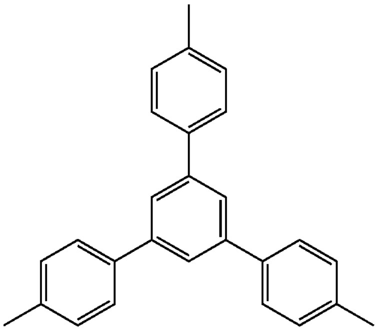

L11

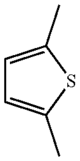

-continued

L12

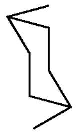

L13

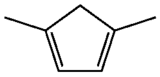

L14

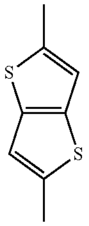

L15

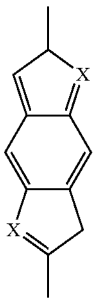

L16

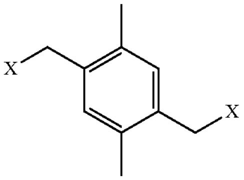

L17

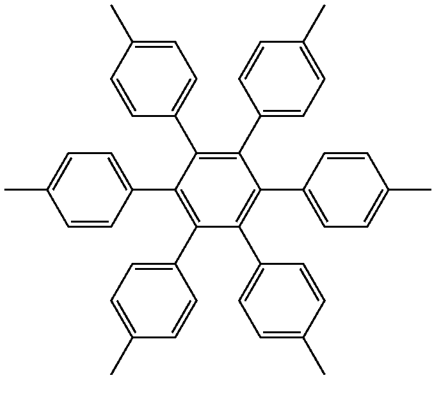

-continued

L18

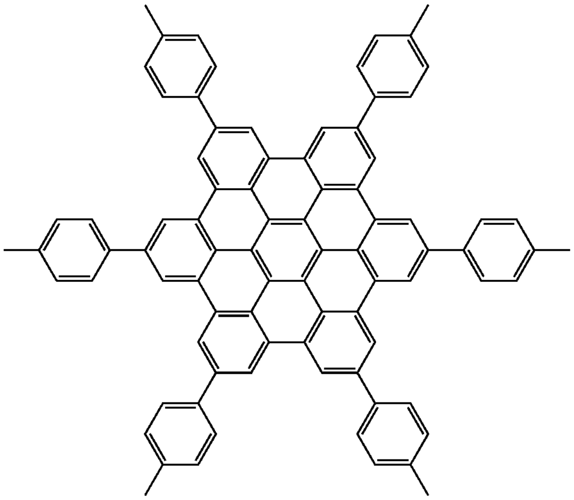

In the exemplary embodiment, the dielectric layer 106A or the first COF material CFL1 is formed on the etch-stop layer 105 by spin-on coating or chemical vapor deposition (CVD). For example, in one embodiment, the precursors (the first compound and the second compound) are mixed and dissolved into an organic solvent (e.g. by dichloromethane, or other suitable solvents) for reaction at room temperature, and then the solution is coated onto the etch-stop layer 105 by spin-on coating. In another embodiment, the precursors (the first compound and the second compound) are heated, and the vapor of the precursors are reacted on the surface of the etch-stop layer 105 by CVD at temperatures of 300° C. or less to form the dielectric layer 106A (or first COF material CFL1).

By using a two-dimensional building block to form the dielectric layer 106A having covalent organic frameworks, the formed dielectric layer 106A will have a dielectric constant of 2 or less, and a thermal conductivity in a range of 1 W/(m·K) to 4 W/(m·K). Furthermore, the Young's modulus of the dielectric layer 106A (or first COF material CFL1) is in a range of 55 GPa to 220 GPa. As such, when the first COF material CFL1 is used in replacement of the conventional low k dielectric materials (typically with dielectric constant of ~3 and thermal conductivity of <1 W/(m·K)) in forming the interconnection layer 106 in the back-end-of-line (BEOL) process, the covalent bonds and highly ordered ring structure in the COF layer enables high thermal conductivities and high mechanical strengths. Overall, the heat dissipation efficiency and the parasitic capacitance of the semiconductor device can be improved to fulfill the needs of BEOL performance and reliability requirement in the advanced node.

Figure 2C:
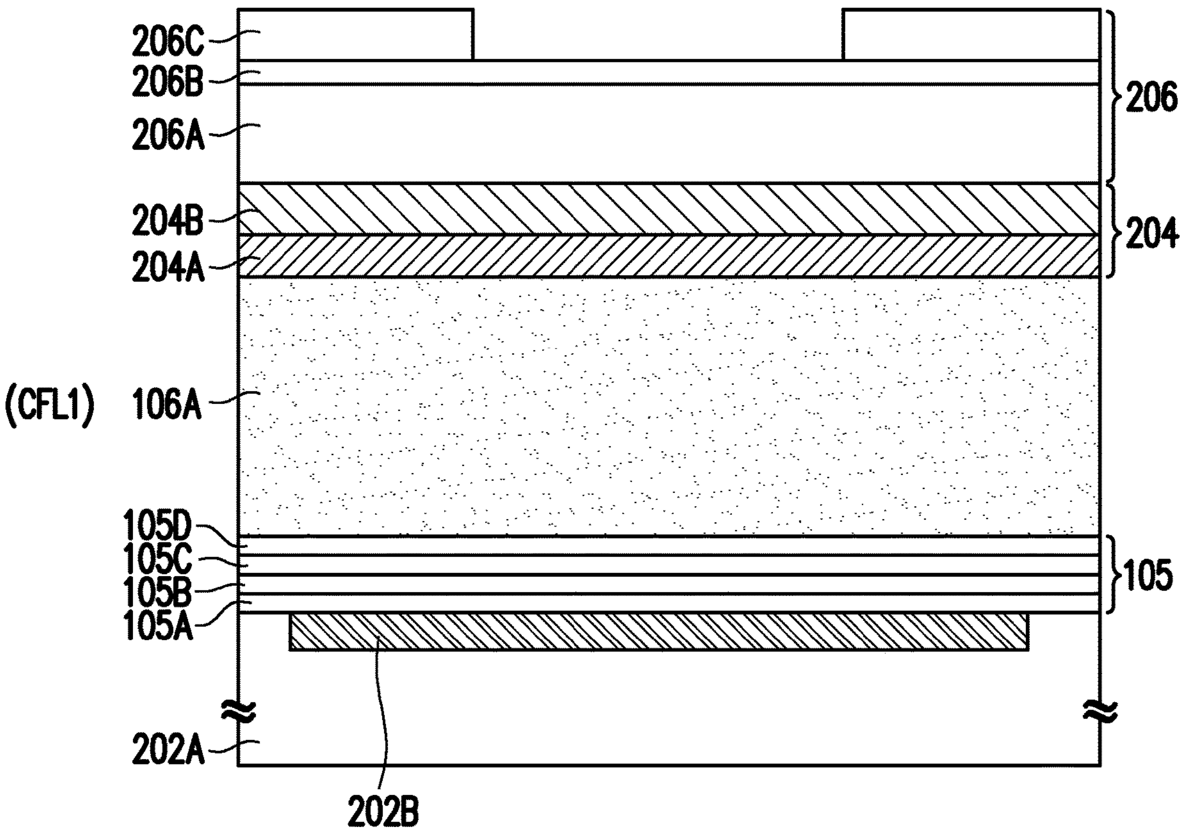

Referring to FIG. 2C, after forming the dielectric layer 106A (or first COF material CFL1), a patterning mask layer 204 is formed over the dielectric layer 106A, and a photoresist 206 is provided on the patterning mask layer 204. In some embodiments, the patterning mask layer 204 includes a first pattern mask 204A disposed on the dielectric layer 106A, and a second pattern mask 204B disposed on the first pattern mask 204A. For example, in one embodiment, the first pattern mask 204A is a nitrogen free anti-reflection layer made of oxides, while the second pattern mask 204B is a titanium nitride (TiN) layer. However, the disclosure is not limited thereto, and the materials of the first pattern mask 204A and the second pattern mask 204B may be suitably adjusted based on design requirements.

Furthermore, the photoresist 206 has a tri-layer structure including a bottom layer 206A, a middle layer 206B and an upper layer 206C. The bottom layer 206A may include a carbon-rich layer or a carbon-containing polymeric material such as novolac resin, or the like. In some alternative embodiments, the bottom layer 206A include other material (s), such as silicon nitride (SiN), silicon oxynitride, other suitable material, or a composition thereof. The middle layer 206B is formed on the bottom layer 206A and may include an oxide layer such as silicon oxide (SiOx). The middle layer 206B is designed to have a composition different from the bottom layer 206A in order to have enough etch selectivity between those two layers. The upper layer 206C is formed on the middle layer 206B and may include a photoresist material.

Figure 2D:
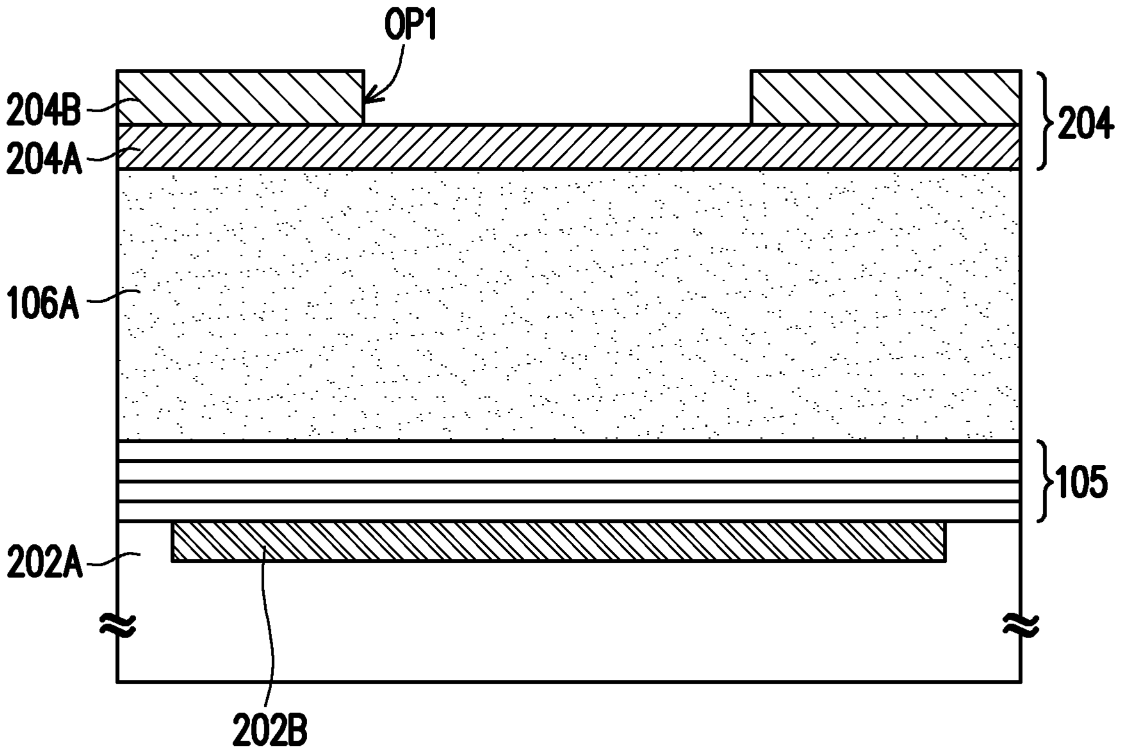

In some embodiments, the upper layer 206C (e.g. photoresist) is patterned by a photolithography process using a photomask to form opening patterns (only one is shown), whereby the opening patterns are transferred to the underlying layers through subsequent etching steps. For example, the middle layer 206B is patterned by using the patterned upper layer 206C as a pattern mask, such that the opening patterns are transferred into the middle layer 206B; and the bottom layer 206A is then patterned by using the patterned upper layer 206C and/or the patterned middle layer 206B as a pattern mask, such that the opening patterns are transferred into the bottom layer 206A. Thereafter, by using the photoresist 206 as a pattern mask, the opening patterns of the photoresist 206 are transferred into the second pattern mask 204B of the patterning mask layer 204. In other words, the second pattern mask 204B of the patterning mask layer 204 may be etched to form an opening OP1 as shown in FIG. 2D using the photoresist 206. Subsequently, the photoresist 206 may be removed, whereby the opening OP1 reveals the underlying first pattern mask 204A.

Figure 2E:
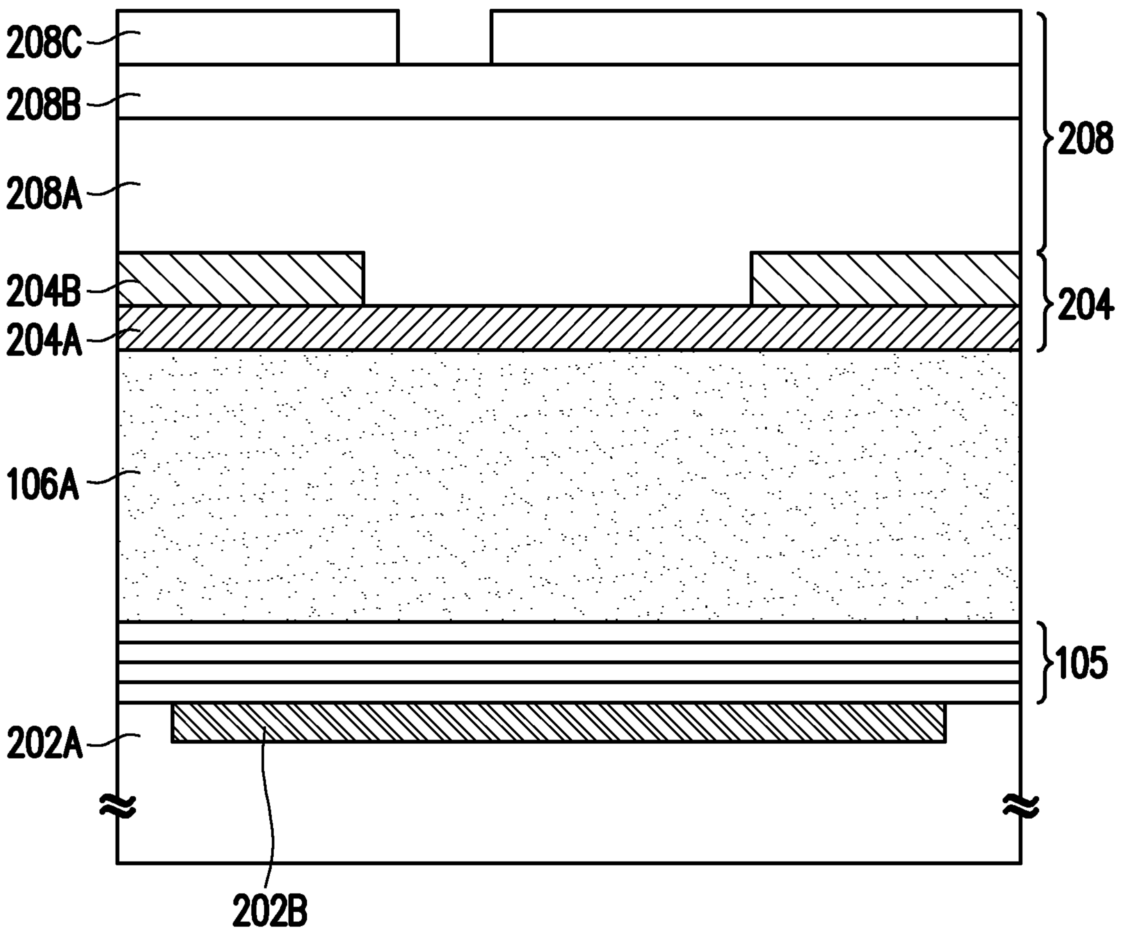
Figure 2F:
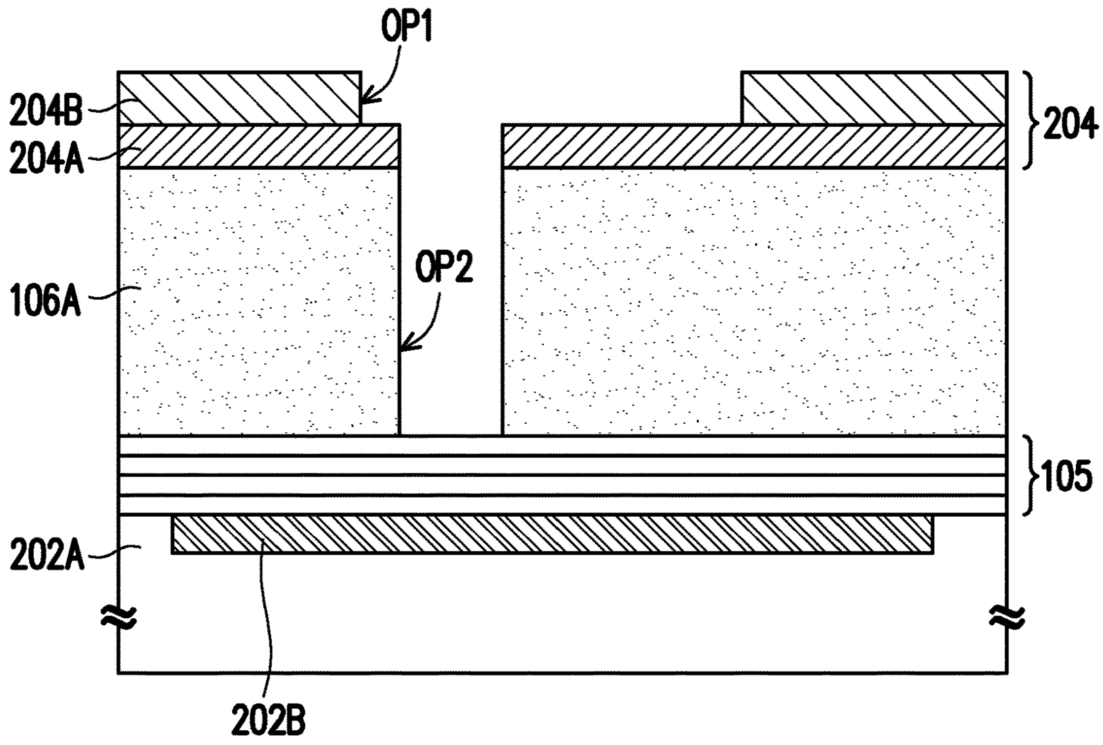

Referring to FIG. 2E, in some embodiments, a second photoresist 208 is provided over the patterning mask layer 204. For example, the second photoresist 208 has a tri-layer structure including a bottom layer 208A, a middle layer 208B and an upper layer 208C similar in material to the bottom layer 206A, the middle layer 206B and the upper layer 206C of the photoresist 206. In some embodiments, the upper layer 208C (e.g. photoresist) is patterned by a photolithography process using a photomask to form opening patterns (only one is shown), whereby the opening patterns are transferred to the underlying layers through subsequent etching steps. For example, the middle layer 208B is patterned by using the patterned upper layer 208C as a pattern mask, such that the opening patterns are transferred into the middle layer 208B; and the bottom layer 208A is then patterned by using the patterned upper layer 208C and/or the patterned middle layer 208B as a pattern mask, such that the opening patterns are transferred into the bottom layer 208A. Thereafter, by using the second photoresist 208 as a pattern mask, the opening patterns of the second photoresist 208 are transferred into the first pattern mask 204A of the patterning mask layer 204. In other words, the first pattern mask 204A of the patterning mask layer 204 may be etched to form a second opening OP2 as shown in FIG. 2F using the second photoresist 208. By using the first pattern mask 204A as a masking layer, the dielectric layer 106A (or first COF material CFL1) may be patterned (or removed) by an ashing process using $N_2/H_2$ plasma at a temperature range from 150° C. to 250° C. After the ashing process, the second opening OP2 reveals an upper surface of the etch-stop layer 105.

Figure 2G:
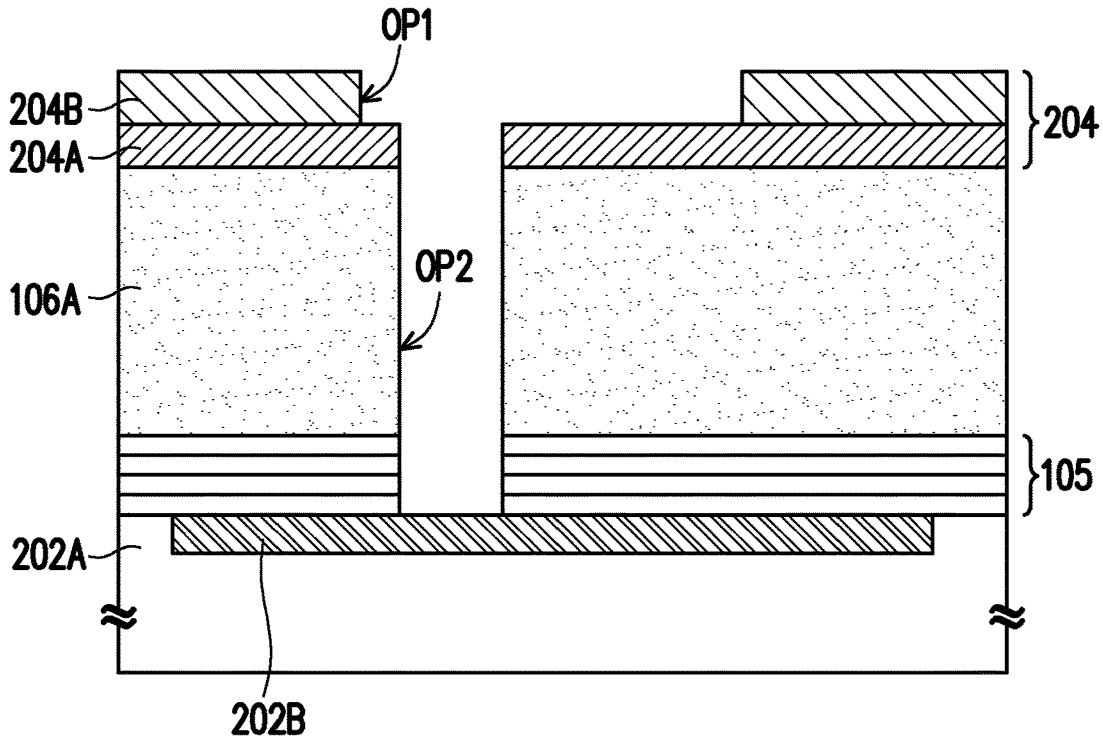
Figure 2H:
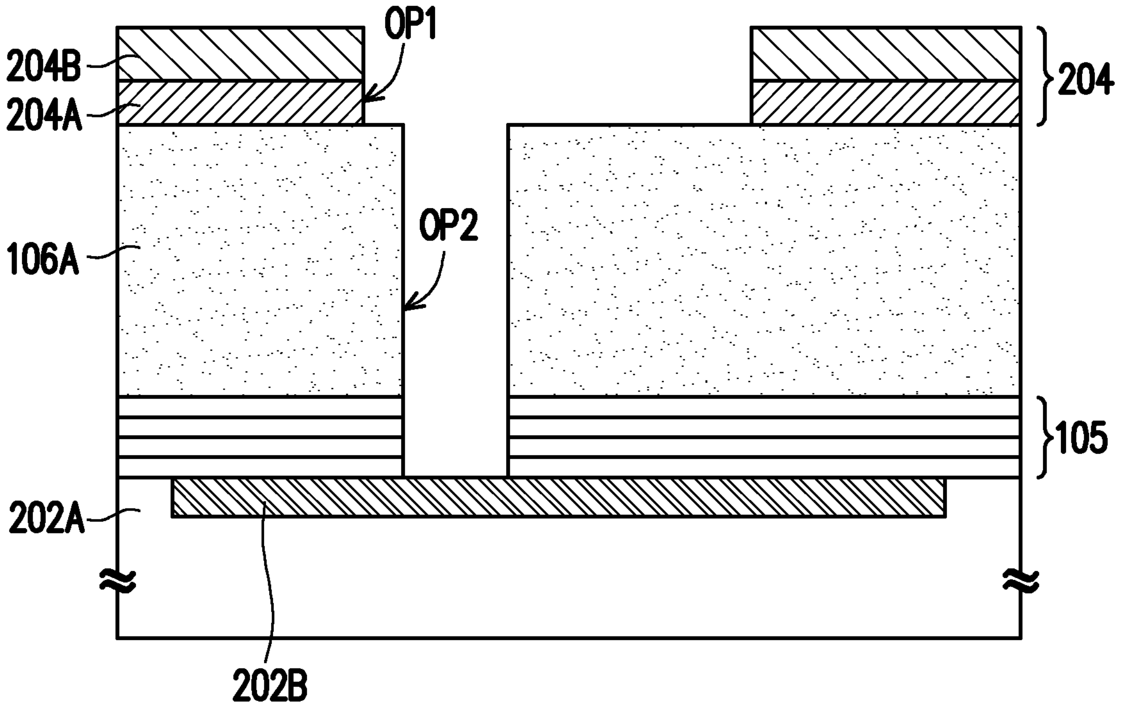

Referring to FIG. 2G, in a next step, the etch-stop layer 105 is further removed. For example, the etch-stop layer 105 is removed so that the second opening OP2 reveals an upper surface of the underlying conductive layer 202B. As illustrated in FIG. 2H, the first pattern mask 204A of the patterning mask layer 204 may be further etched so that the first opening OP1 reveals a top surface of the dielectric layer 106A (or first COF material CFL1). For example, the first pattern mask 204A is etched so that sidewalls of the first pattern mask 204A are aligned with sidewalls of the second pattern mask 204B.

Figure 2I:
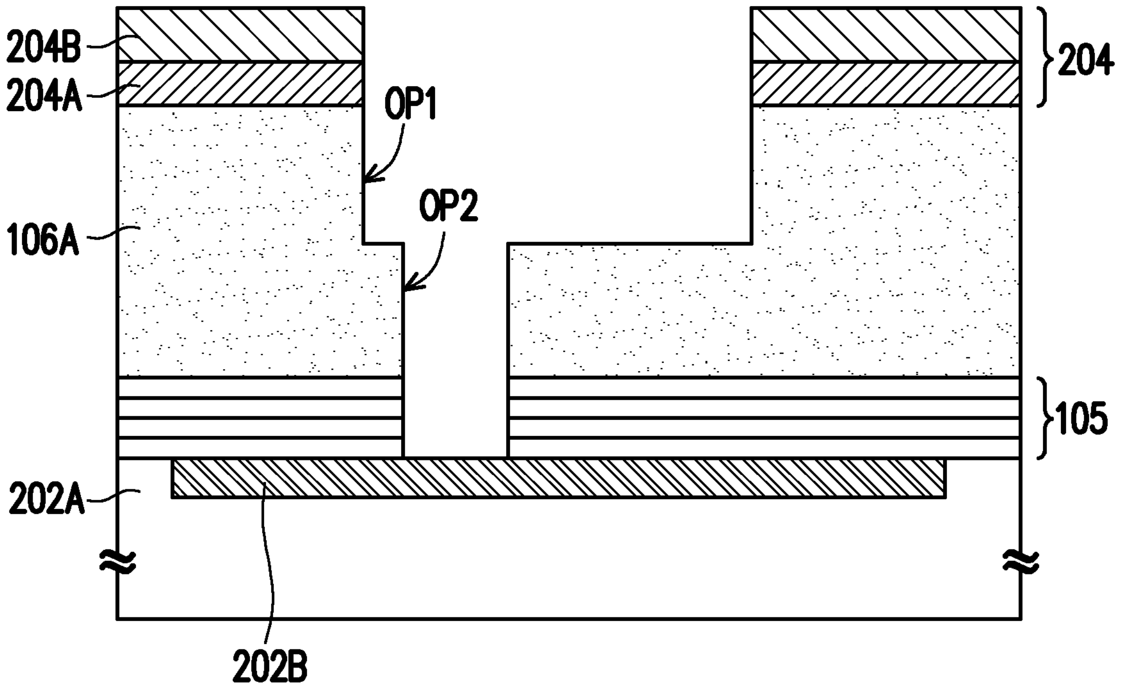

Referring to FIG. 2I, in a subsequent step, the dielectric layer 106A (or first COF material CFL1) may be patterned (or removed) by an ashing process using $N_2/H_2$ plasma at a temperature range from 150° C. to 250° C. After the ashing process, the first opening OP1 extends into the dielectric layer 106A (or first COF material CFL1), whereby the second opening OP2 overlaps with the first opening OP1 in the dielectric layer 106A (or first COF material CFL1).

Figure 2J:
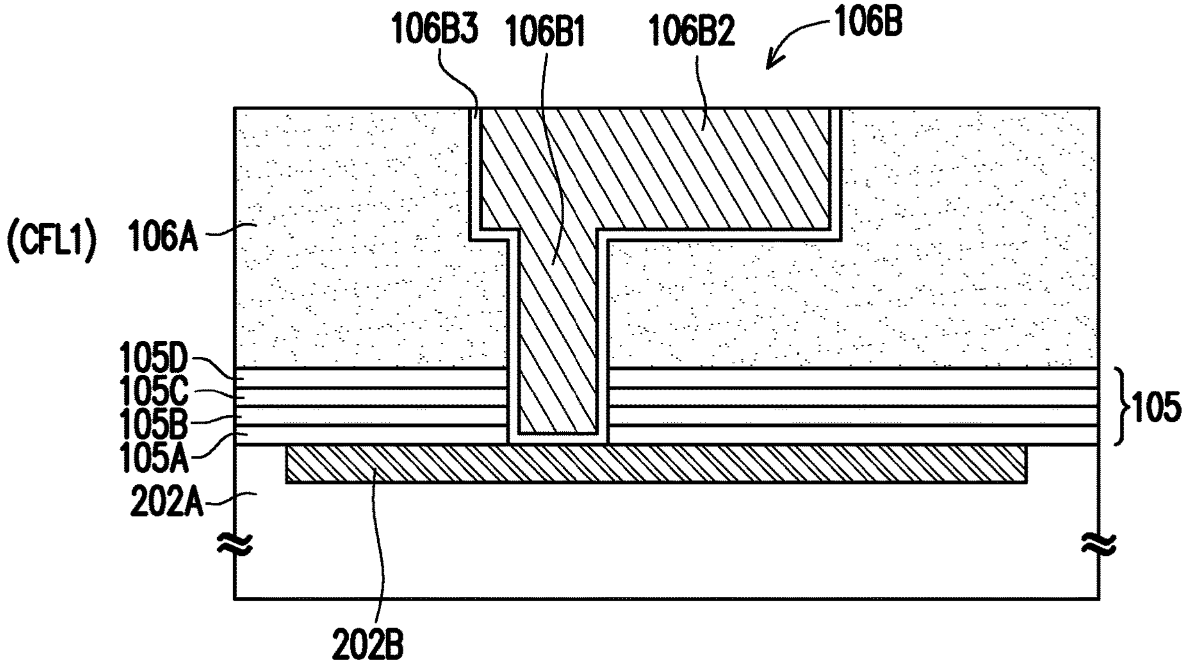

Referring to FIG. 2J, a conductive layer 106B is filled into the first opening OP1 and the second opening OP2. For example, forming the conductive layer 106B includes conformally forming a barrier layer 106B3 in the first opening OP1 and the second opening OP2, and forming a conductive material including conductive vias 106B1 and conductive patterns 106B2 on the barrier layer 106B3. In some embodiments, the barrier layer 106B3 includes tantalum (Ta), tantalum nitride (TaN), a combination thereof, or the like. In certain embodiments, the conductive vias 106B1 and the conductive patterns 106B2 include materials such as aluminum, titanium, copper, nickel, tungsten, or alloys thereof. After forming the conductive layer 106B, the patterning mask layer 204 is removed, and a planarization process (e.g., a chemical-mechanical planarization (CMP) process) is performed to remove excessive conductive material of the conductive layer 106B. As such, a top surface of the conductive layer 106B may be aligned with a top surface of the dielectric layer 106A (or first COF material CFL1).

Figure 2K:
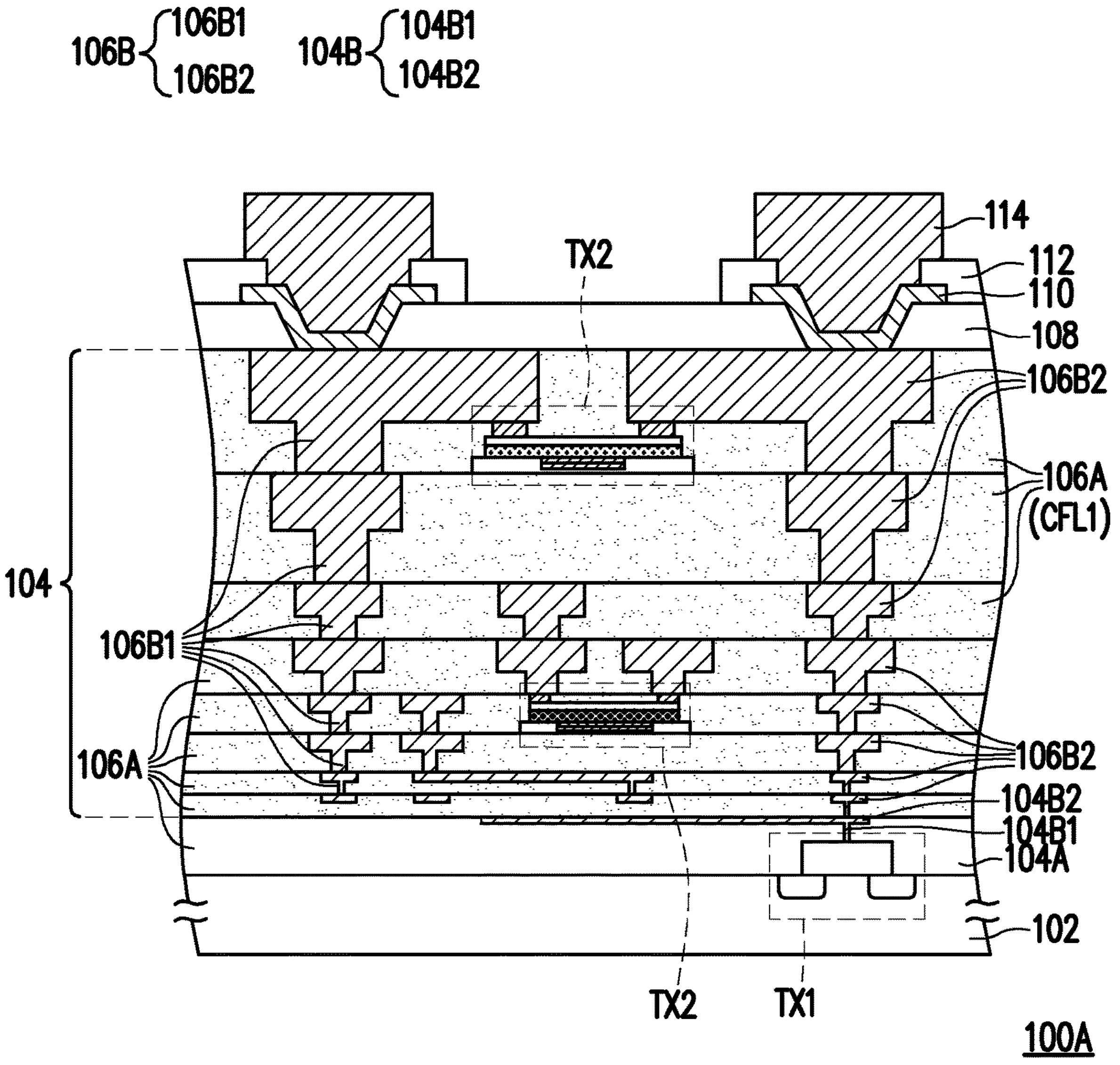

Referring to FIG. 2K, the formation of the interconnection layer 106 may be completed by repeating the steps illustrated in FIG. 2A to FIG. 2J. In FIG. 2K, the etch-stop layer 105 is omitted for ease of illustration, and it should be noted that the etch-stop layers 105 are located below each of the dielectric layers 106A in the manner shown in FIG. 2J. After forming the interconnection layer 106, the passivation layer 108, the post-passivation layer 112, the conductive pads 110, and the conductive terminals 114 are formed over the interconnection layer 106 in a similar manner as described in FIG. 1. Up to here, a semiconductor device 100A in accordance with some embodiments of the present disclosure is accomplished. In the semiconductor device 100A, since the first COF material CFL1 is used in replacement of the conventional low-k dielectric materials (typically with dielectric constant of ~3 and thermal conductivity of <1 W/(m·K)) in the interconnection layer 106, the covalent bonds and highly ordered ring structure in the COF layer enables high thermal conductivities and high mechanical strengths. Overall, the heat dissipation efficiency and the parasitic capacitance of the semiconductor device 100A can be improved to fulfill the needs of BEOL performance and reliability requirement in the advanced node.

Figure 3A:
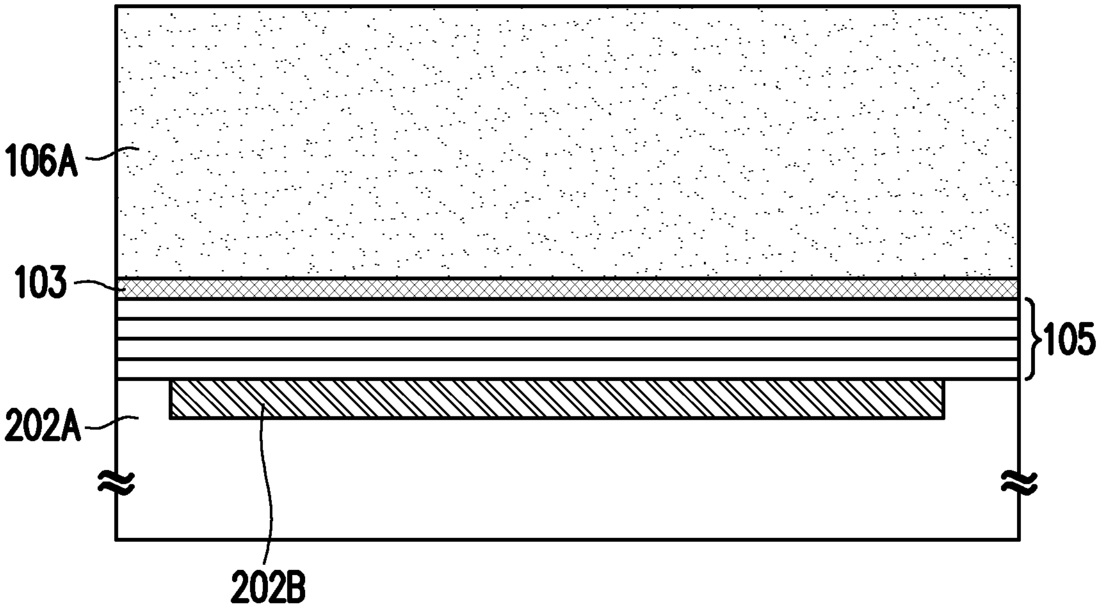
FIG. 3A to FIG. 3C are schematic cross-sectional views illustrating various stages in a method of fabricating a semiconductor device in accordance with some other embodiments of the disclosure.
Figure 3B:
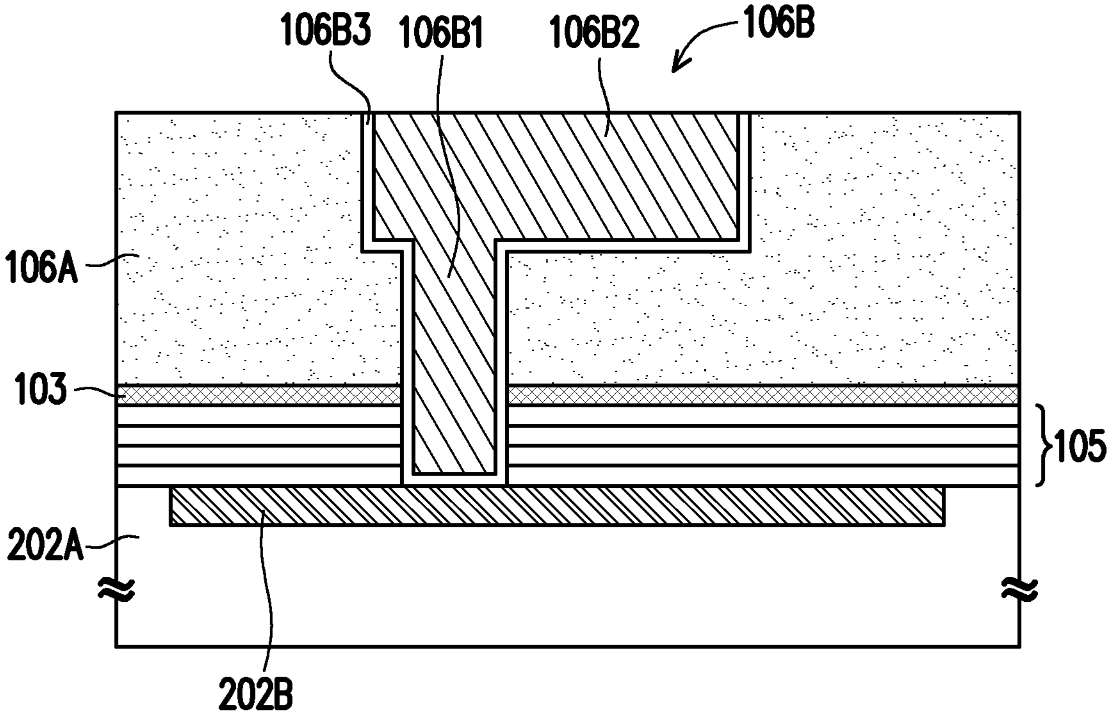
Figure 3C:
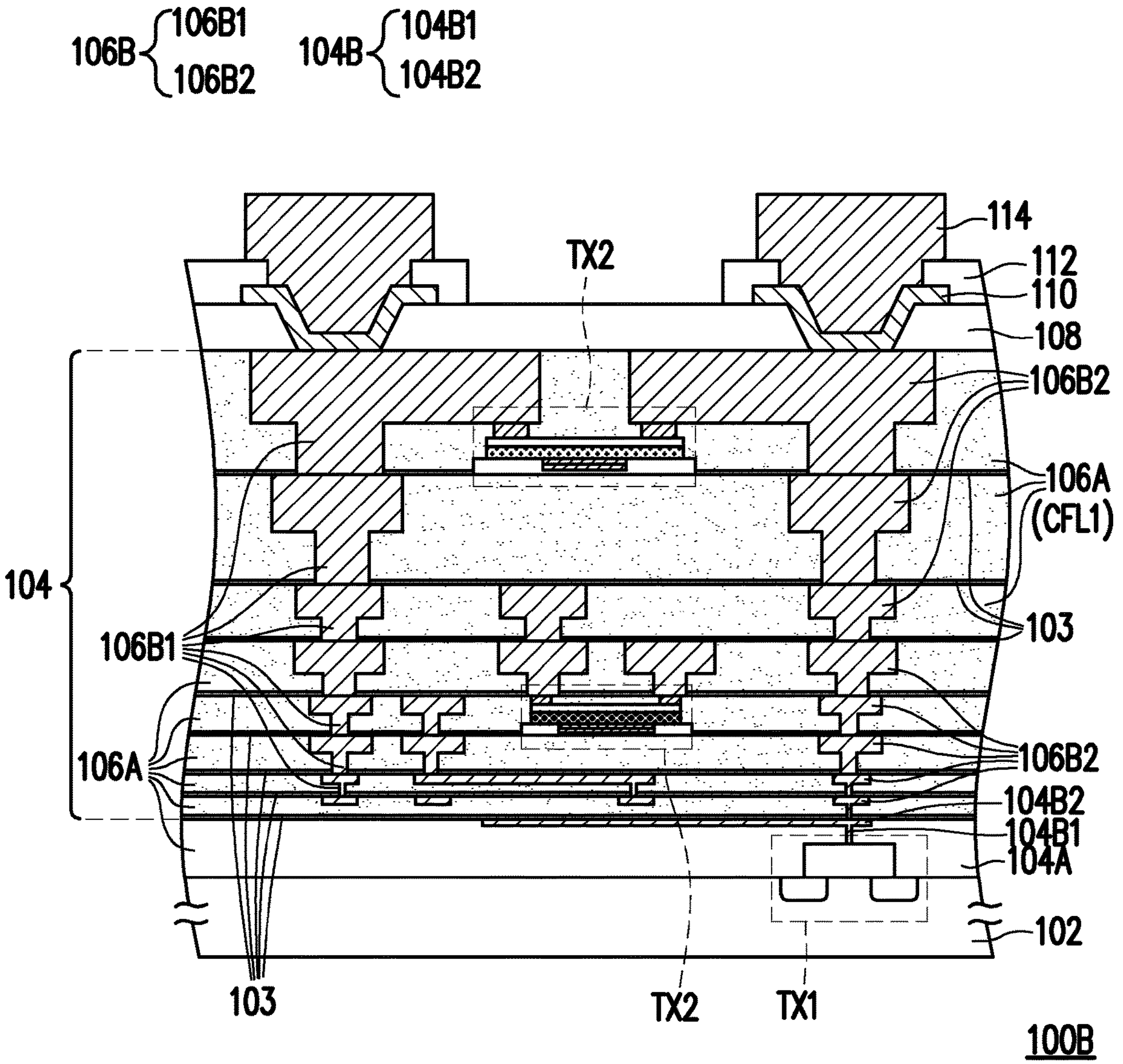

FIG. 3A to FIG. 3C are schematic cross-sectional views illustrating various stages in a method of fabricating a semiconductor device in accordance with some other embodiments of the disclosure. The method illustrated in FIG. 3A to FIG. 3C is similar to the method illustrated in FIG. 2A to FIG. 2K. Therefore, the same reference numerals are used to refer to the same or liked parts, and its detailed description will be omitted herein. As illustrated in FIG. 3A, after forming an etch-stop layer 105 over the underlying dielectric layer 202A, a two-dimensional material layer 103 is formed over the etch-stop layer 105. For example, the two-dimensional material layer 103 is made of two-dimensional materials such as graphene, transition-metal dichalcogenides, or the like. In some embodiments, the two-dimensional material layer 103 may be two-dimensional materials containing carbon, tungsten, sulfur, oxygen, selenium (Se), tellurium (Te), molybdenum (Mo), nitrogen, tantalum (Ta), titanium, or may include other metals. In certain embodiments, the two-dimensional material layer 103 is a monolayer that has a thickness in a range of 0.3 nm to 0.5 nm. After forming the two-dimensional material layer 103, the dielectric layer 106A (or first COF material CFL1) may be formed on the two-dimensional material layer 103 by a similar method described in FIG. 2A. For example, the thickness of the two-dimensional material layer 103 is smaller than a thickness of the dielectric layer 106A (or first COF material CFL1).

Referring to FIG. 3B, the method described in FIG. 2B to FIG. 2J may be performed to pattern the dielectric layer 106A (or first COF material CFL1), and to form the conductive layer 106B in the dielectric layer 106A. For example, after forming the conductive layer 106B in the first opening OP1 and the second opening OP2 (shown in FIG. 2I), the conductive layer 106B is surrounded by the etch-stop layer 105, the two-dimensional material layer 103, and further surrounded by the dielectric layer 106A (or first COF material CFL1).

Referring to FIG. 3C, the formation of the interconnection layer 106 may be completed by repeating the steps illustrated in FIG. 3A to FIG. 3B. Thereafter, the passivation layer 108, the post-passivation layer 112, the conductive pads 110, and the conductive terminals 114 are formed over the interconnection layer 106 in a similar manner as described in FIG. 1. Up to here, a semiconductor device 100B in accordance with some embodiments of the present disclosure is accomplished. Similar to the above embodiments, in the semiconductor device 100B, since the first COF material CFL1 is used in replacement of the conventional low-k dielectric materials (typically with dielectric constant of ~3 and thermal conductivity of <1 W/(m·K)) in the interconnection layer 106, the covalent bonds and highly ordered ring structure in the COF layer enables high thermal conductivities and high mechanical strengths. In addition, the presence of the two-dimensional material layer 103 further improves the mechanical strengths and enables high thermal conductivities. Overall, the heat dissipation efficiency and the parasitic capacitance of the semiconductor device 100B can be improved to fulfill the needs of BEOL performance and reliability requirement in the advanced node.

FIG. 4A to FIG. 4E are schematic cross-sectional views illustrating various stages in a method of fabricating a semiconductor device in accordance with some other embodiments of the disclosure. The method illustrated in FIG. 4A to FIG. 4E is similar to the method illustrated in FIG. 2A to FIG. 2K. Therefore, the same reference numerals are used to refer to the same or liked parts, and its detailed description will be omitted herein. The difference between the embodiments is that a second covalent organic framework (COF) material CFL2 (or second COF layer CFL2) is used in replacement of the first COF material CFL1 as the dielectric layer 106A.

Figure 4A:
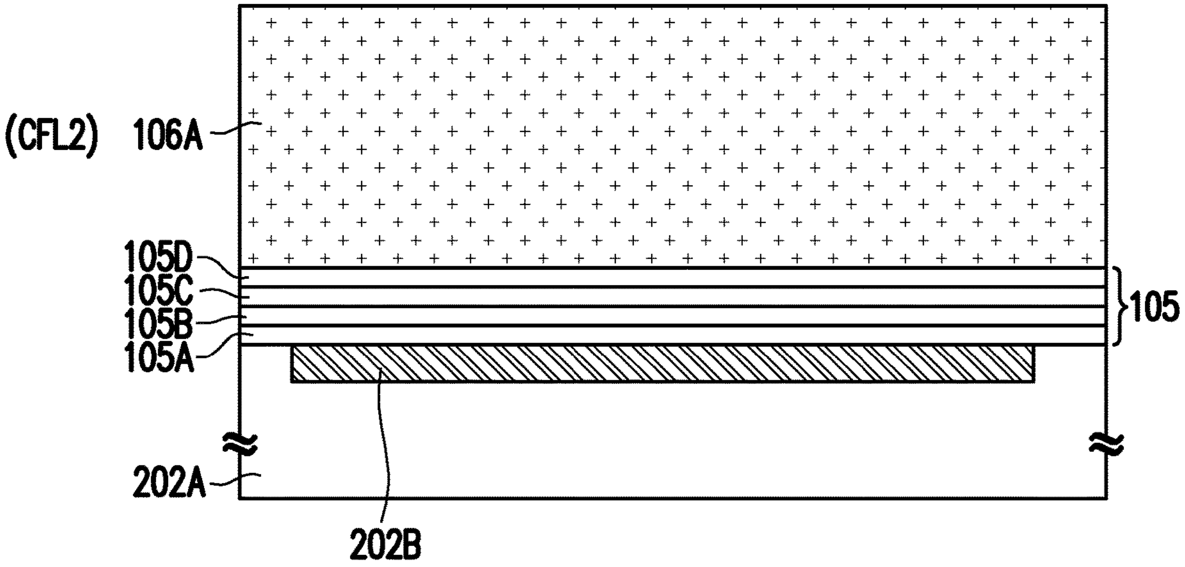
FIG. 4A to FIG. 4E are schematic cross-sectional views illustrating various stages in a method of fabricating a semiconductor device in accordance with some other embodiments of the disclosure.

Referring to FIG. 4A, an etch-stop layer 105 is formed over an underlying dielectric layer 202A and over an underlying conductive layer 202B. Thereafter, a dielectric layer 106A is formed over the etch-stop layer 105. In the exemplary embodiment, the dielectric layer 106A is a second COF material CFL2. For example, the second COF material CFL2 is a three-dimensional COF layer. In the exemplary embodiment, the three-dimensional COF is formed by a reaction between a third compound having a partial structure represented by formula IIA and a fourth compound having a partial structure represented by formula IIB to form an imine (>C=N—).

formula IIA

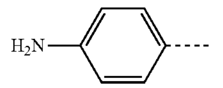

formula IIB

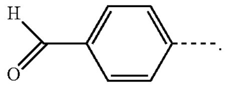

Figure 4B:
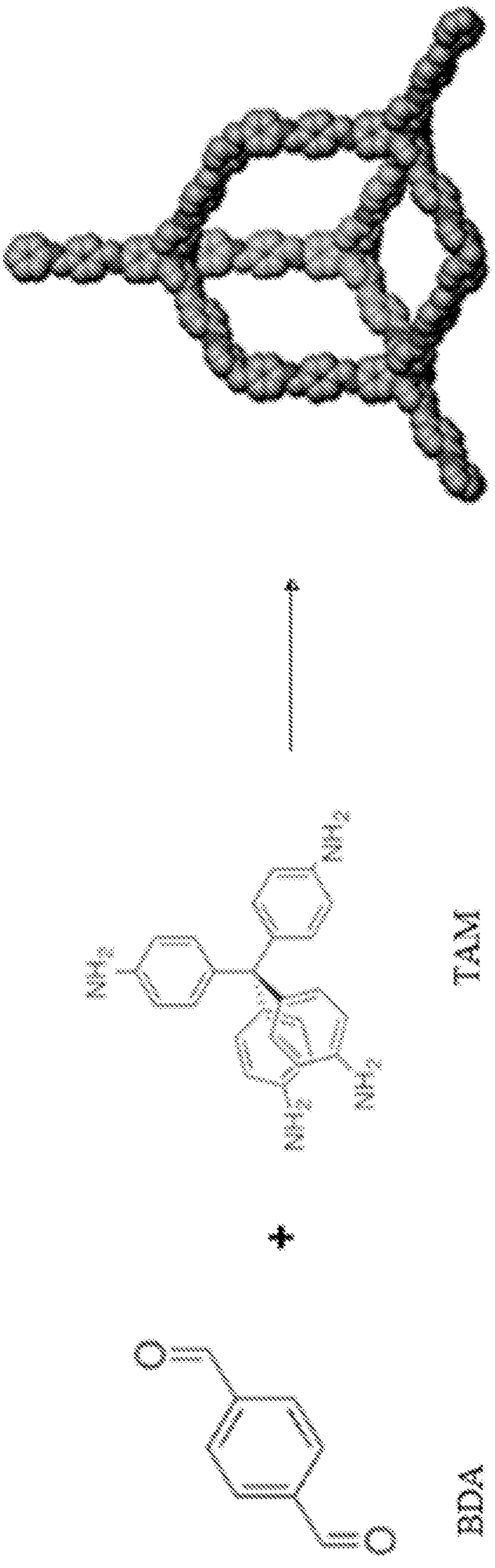

For example, referring to FIG. 4B, the third compound is tetrakis(4-aminophenyl)methane (TAM), and the fourth compound is benzene-1,4-dicarbaldehyde (BDA), whereby TAM and BDA may react to form a three-dimensional building block COF-300.

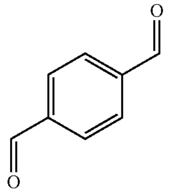

BDA

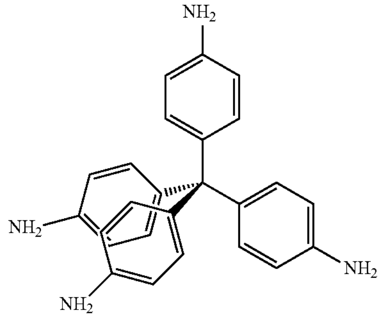

TAM

In the above embodiments, although the third compound and the fourth compound have a certain structure as designated above, it is noted that the disclosure is not limited thereto. For example, the partial structure represented by formula IIA and the partial structure represented by formula IIB may be further linked to the linkers Lx (including L1-L18) exemplified above to form third and fourth compounds having different structures. In addition, although the two-dimensional building blocks or the three-dimensional building blocks mentioned above are constructed through boronic ester connections or imine connections, it is noted that other types of connections may be used to form the two-dimensional building blocks or three-dimensional building blocks. For example, one or two types of precursor compounds may be reacted to form covalent organic frameworks that are constructed by boroxine, hydrazone, azine, P-ketoenamine, imide connections, or the like.

In the exemplary embodiment, the dielectric layer 106A or the second COF material CFL2 is formed on the etch-stop layer 105 by spin-on coating or chemical vapor deposition (CVD). For example, in one embodiment, the precursors (the third compound and the fourth compound) are mixed and dissolved into an organic solvent (e.g. by dichloromethane, or other suitable solvents) for reaction at room temperature, and then the solution is coated onto the etch-stop layer 105 by spin-on coating. In another embodiment, the precursors (the third compound and the fourth compound) are heated, and the vapor of the precursors are reacted on the surface of the etch-stop layer 105 by CVD at temperatures of 300° C. or less to form the dielectric layer 106A (or second COF material CFL2).

By using a three-dimensional building block to form the dielectric layer 106A having covalent organic frameworks, the formed dielectric layer 106A will have a dielectric constant of 2 or less, and a thermal conductivity will be greater than 4 W/(m·K). Furthermore, the Young's modulus of the dielectric layer 106A (or second COF material CFL2) is in a range of 220 GPa to 350 GPa. In other words, the second COF material CFL2 will have a higher thermal conductivity and higher Young's modulus than the first COF material CFL1. As such, higher thermal conductivities and higher mechanical strengths can be obtained.

Figure 4C:
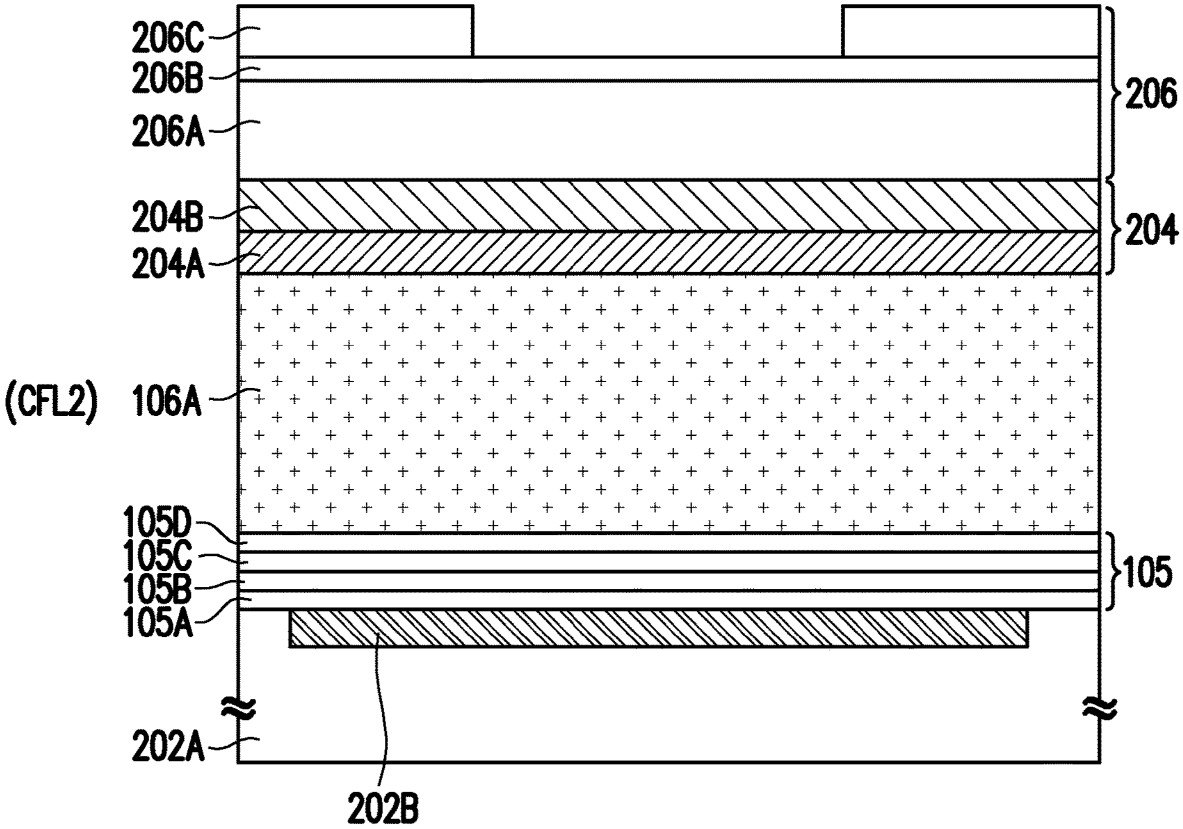
Figure 4D:
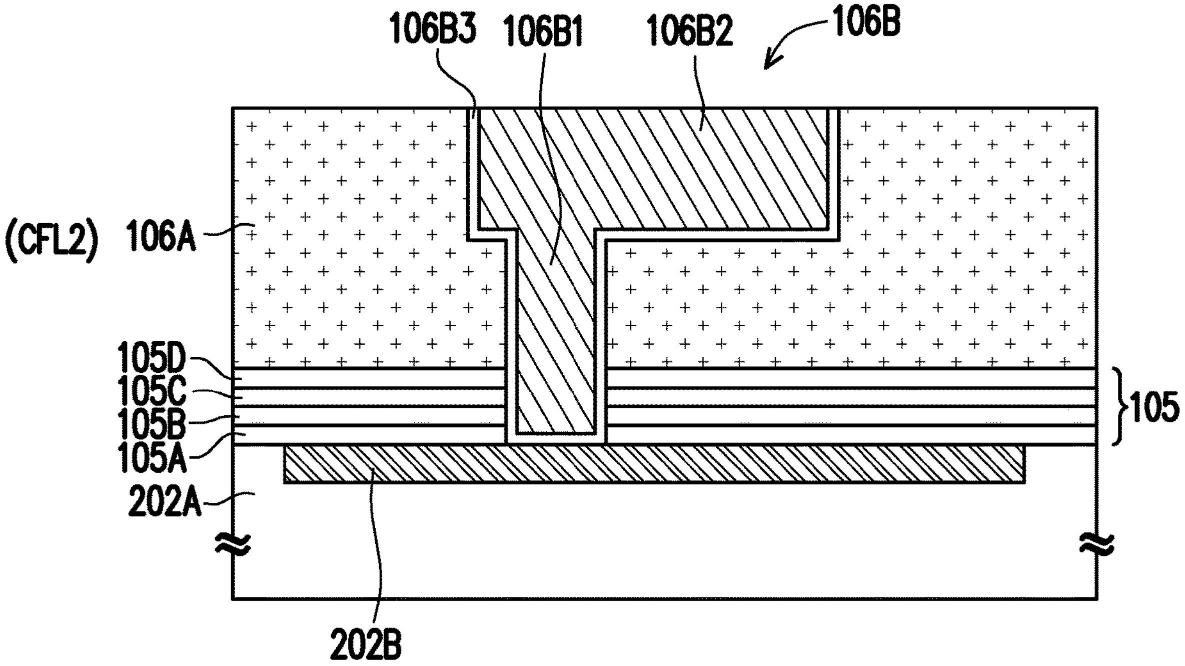

Referring to FIG. 4C, after forming the dielectric layer 106A (or second COF material CFL2), a patterning mask layer 204 is formed over the dielectric layer 106A, and a photoresist 206 is provided on the patterning mask layer 204. The patterning mask layer 204 and the photoresist 206 are the same as described in FIG. 2C, thus its details will not be repeated herein. Thereafter, referring to FIG. 4D, the method described in FIG. 2D to FIG. 2J may be performed to pattern the dielectric layer 106A (or first second material CFL2), and to form the conductive layer 106B in the dielectric layer 106A. For example, after forming the conductive layer 106B in the first opening OP1 and the second opening OP2 (shown in FIG. 2I), the conductive layer 106B is surrounded by the etch-stop layer 105 and the dielectric layer 106A (or second COF material CFL2).

Figure 4E:
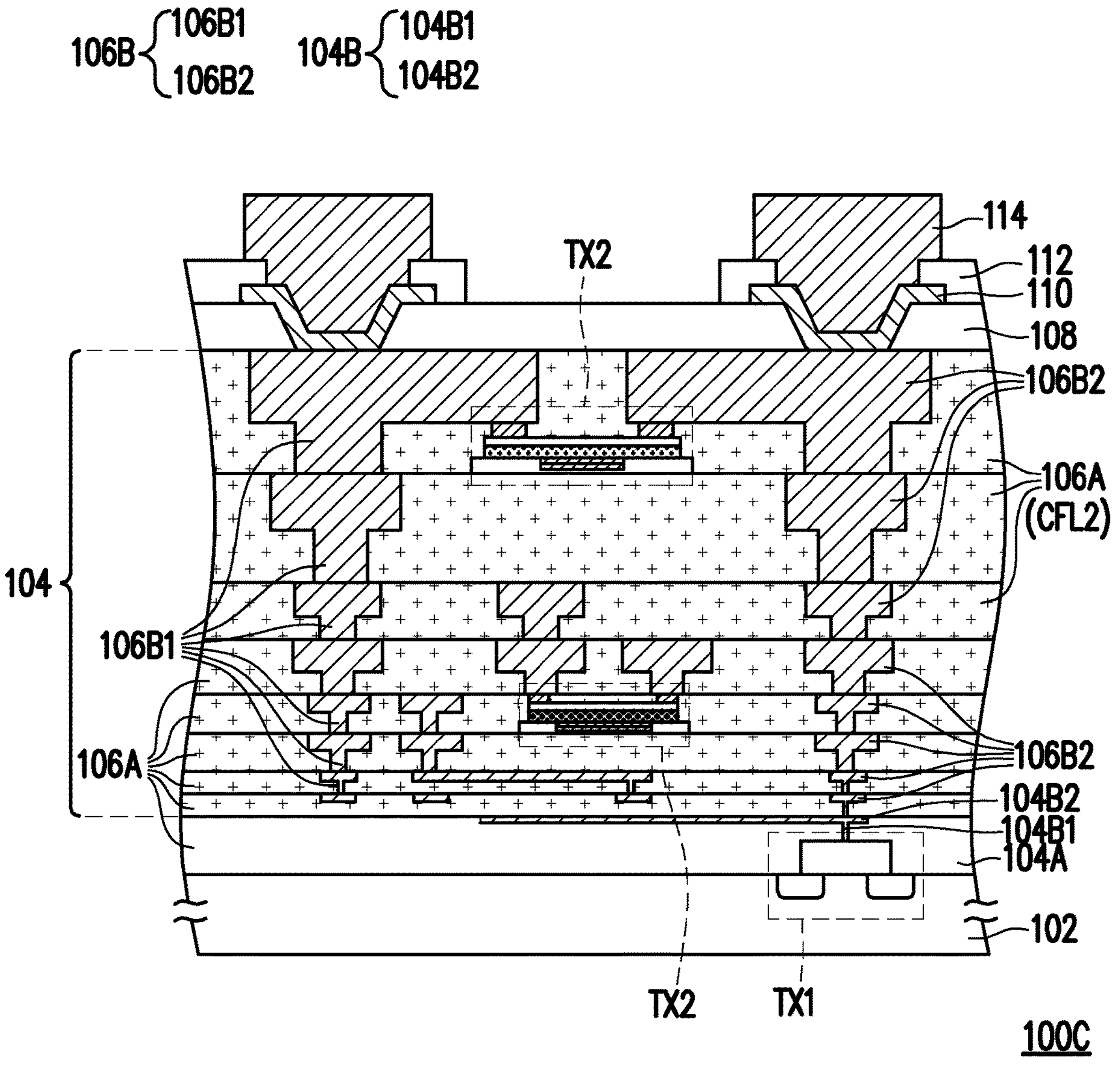

Referring to FIG. 4E, the formation of the interconnection layer 106 may be completed by repeating the steps illustrated in FIG. 4A to FIG. 4D. Thereafter, the passivation layer 108, the post-passivation layer 112, the conductive pads 110, and the conductive terminals 114 are formed over the interconnection layer 106 in a similar manner as described in FIG. 1. Up to here, a semiconductor device 100C in accordance with some embodiments of the present disclosure is accomplished. Similar to the above embodiments, in the semiconductor device 100C, since the second COF material CFL2 (with three-dimensional building block) is used in replacement of the conventional low-k dielectric materials (typically with dielectric constant of ~3 and thermal conductivity of <1 W/(m·K)) in the interconnection layer 106, the covalent bonds and highly ordered ring structure in the COF layer enables high thermal conductivities and high mechanical strengths. Furthermore, due to the formation of three-dimensional building blocks in the second COF material CFL2, the thermal conductivities and mechanical strengths can be further improved as compared with the first COF material CFL1 with two-dimensional building blocks. Overall, the heat dissipation efficiency and the parasitic capacitance of the semiconductor device 100C can be further improved to fulfill the needs of BEOL performance and reliability requirement in the advanced node.

Figure 5A:
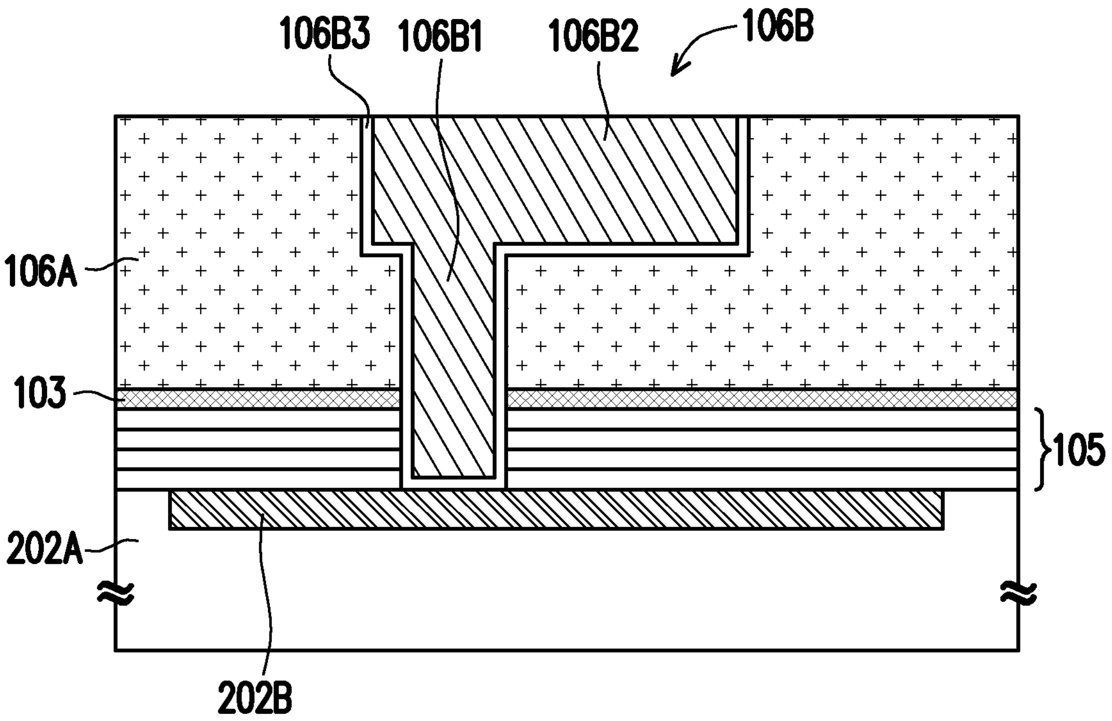
FIG. 5A to FIG. 5B are schematic cross-sectional views illustrating various stages in a method of fabricating a semiconductor device in accordance with some other embodiments of the disclosure.
Figure 5B:
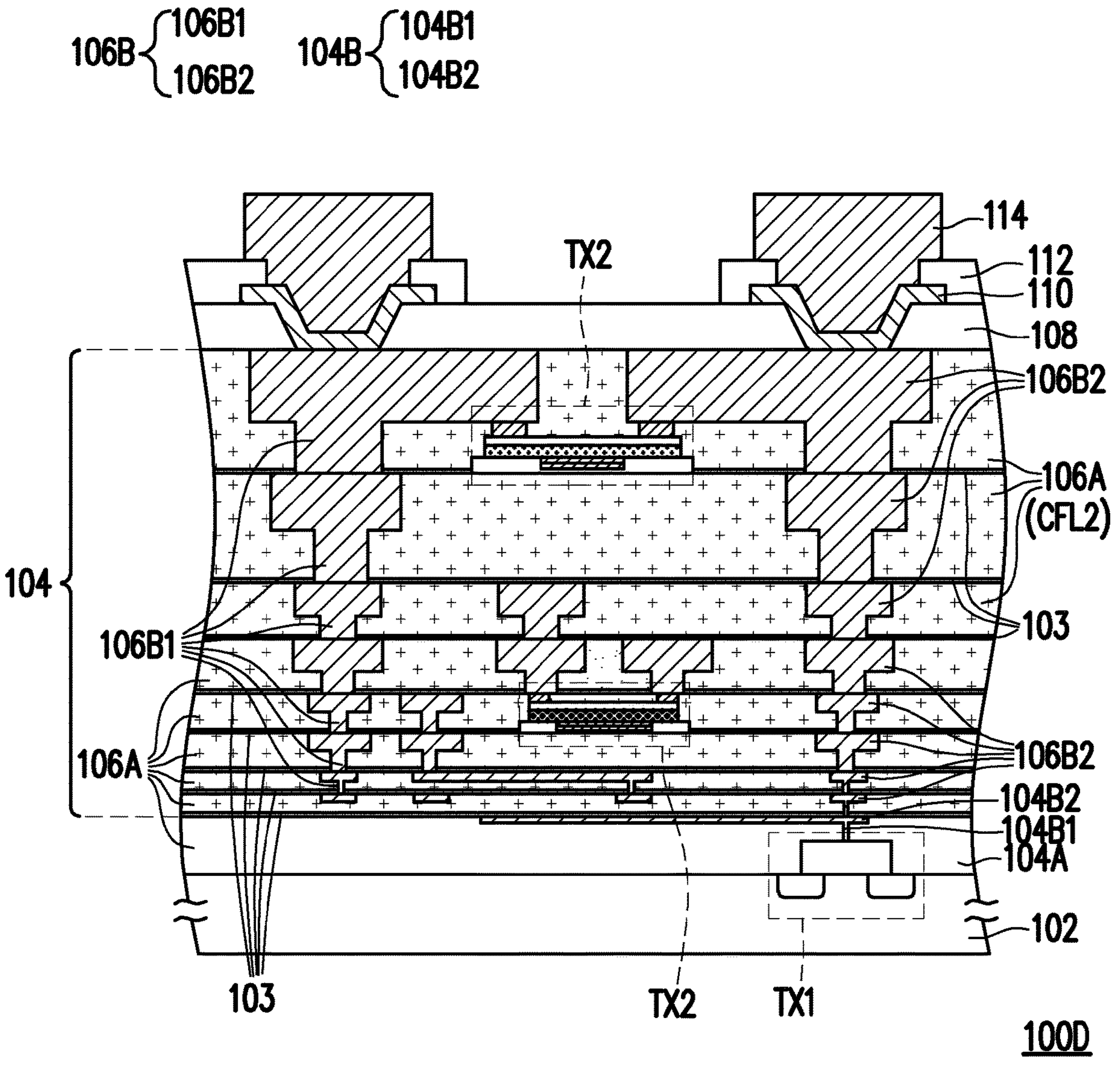

FIG. 5A to FIG. 5B are schematic cross-sectional views illustrating various stages in a method of fabricating a semiconductor device in accordance with some other embodiments of the disclosure. The method illustrated in FIG. 5A to FIG. 5B is similar to the method illustrated in FIG. 4A to FIG. 4E. Therefore, the same reference numerals are used to refer to the same or liked parts, and its detailed description will be omitted herein. As illustrated in FIG. 5A, after forming an etch-stop layer 105 over the underlying dielectric layer 202A, a two-dimensional material layer 103 is formed over the etch-stop layer 105. For example, the two-dimensional material layer 103 is made of two-dimensional materials such as graphene, transition-metal dichalcogenides, or the like. In some embodiments, the two-dimensional material layer 103 may be two-dimensional materials containing carbon, tungsten, sulfur, oxygen, selenium (Se), tellurium (Te), molybdenum (Mo), nitrogen, tantalum (Ta), titanium, or may include other metals. In certain embodiments, the two-dimensional material layer 103 has a thickness in a range of 0.3 nm to 0.5 nm. After forming the two-dimensional material layer 103, the dielectric layer 106A (or second COF material CFL2) may be formed on the two-dimensional material layer 103 by a similar method described in FIG. 4A.

As illustrated in FIG. 5A, after forming the dielectric layer 106A (or second COF material CFL2), the method described in FIG. 2B to FIG. 2J may be performed to pattern the dielectric layer 106A (or first COF material CFL1), and to form the conductive layer 106B in the dielectric layer 106A. For example, after forming the conductive layer 106B in the first opening OP1 and the second opening OP2 (shown in FIG. 2I), the conductive layer 106B is surrounded by the etch-stop layer 105, the two-dimensional material layer 103, and further surrounded by the dielectric layer 106A (or second COF material CFL2).

Referring to FIG. 5B, the formation of the interconnection layer 106 may be completed by repeating the formation of the structure illustrated in FIG. 5A. Thereafter, the passivation layer 108, the post-passivation layer 112, the conductive pads 110, and the conductive terminals 114 are formed over the interconnection layer 106 in a similar manner as described in FIG. 1. Up to here, a semiconductor device 100D in accordance with some embodiments of the present disclosure is accomplished. Similar to the above embodiments, in the semiconductor device 100D, since the second COF material CFL2 (with three-dimensional building block) is used in replacement of the conventional low-k dielectric materials (typically with dielectric constant of ~3 and thermal conductivity of <1 W/(m·K)) in the interconnection layer 106, the covalent bonds and highly ordered ring structure in the COF layer enables high thermal conductivities and high mechanical strengths. Furthermore, due to the formation of three-dimensional building blocks in the second COF material CFL2, the thermal conductivities and mechanical strengths can be further improved as compared with the first COF material CFL1 with two-dimensional building blocks. In addition, the presence of the two-dimensional material layer 103 further improves the mechanical strengths and enables high thermal conductivities. Overall, the heat dissipation efficiency and the parasitic capacitance of the semiconductor device 100D can be further improved to fulfill the needs of BEOL performance and reliability requirement in the advanced node.

Figure 6:
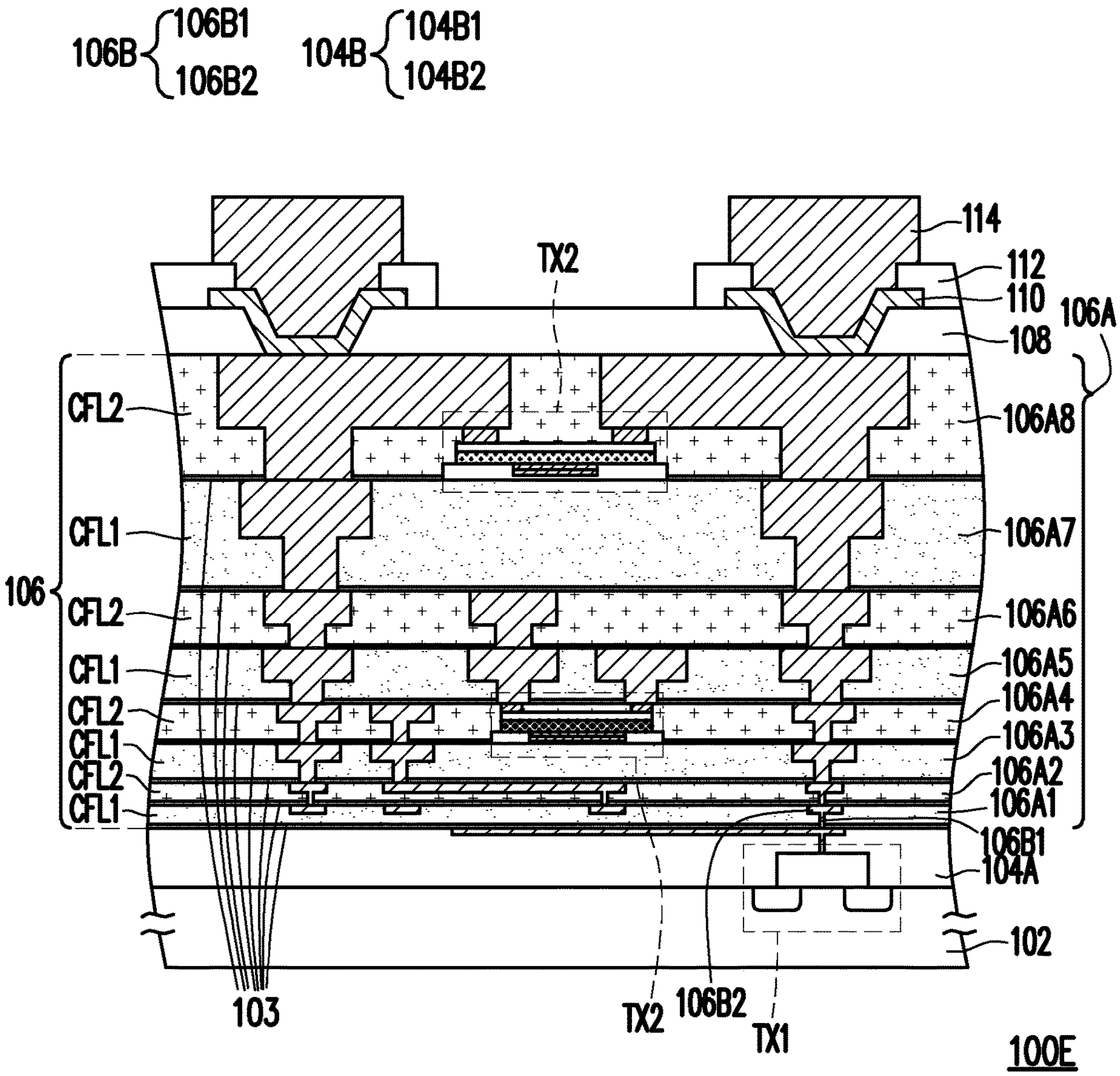
FIG. 6 is a schematic cross-sectional view of a semiconductor device in accordance with some other embodiments of the disclosure.

FIG. 6 is a schematic cross-sectional view of a semiconductor device in accordance with some other embodiments of the disclosure. The semiconductor device 100E shown in FIG. 6 is similar to the semiconductor device 100B shown in FIG. 3C. Therefore, the same reference numerals are used to refer to the same or liked parts, and its detailed description will be omitted herein. The difference between the embodiments is that both the first COF material CFL1 and the second COF material CFL2 are used in the formation of the dielectric layer 106A in the semiconductor device 100E.

As illustrated in FIG. 6, the dielectric layers 106A includes a first dielectric layer 106A1 (first COF layer), a second dielectric layer 106A2 (second COF layer), a third dielectric layer 106A3 (third COF layer), a fourth dielectric layer 106A4 (fourth COF layer), a fifth dielectric layer 106A5 (fifth COF layer), a sixth dielectric layer 106A6 (sixth COF layer), a seventh dielectric layer 106A7 (seventh COF layer) and an eighth dielectric layer 106A8 (eighth COF layer) disposed over the bottom dielectric layer 104A and stacked up in sequence. In the exemplary embodiment, the first, third, fifth, and seventh dielectric layer (106A1, 106A3, 106A5 and 106A7) are made of the first COF material CFL1, while the second, fourth, sixth and eighth dielectric layer (106A2, 106A4, 106A6 and 106A8) are made of the second COF material CFL2. In other words, the dielectric layers 106A made of the second COF material CFL2 having higher thermal conductivity are interposed between the dielectric layers 106A made of the first COF material CFL1. Furthermore, each of the dielectric layers (106A1-106A8) have a two-dimensional material layer 103 and an etch-stop layer 105 (not shown) located underneath (corresponding to the structure shown in FIG. 3B or FIG. 5A).

Similar to the above embodiments, in the semiconductor device 100E, since the first COF material CFL1 (with two-dimensional building block) and the second COF material CFL2 (with three-dimensional building block) are used in replacement of the conventional low-k dielectric materials (typically with dielectric constant of ~3 and thermal conductivity of <1 W/(m·K)) in the interconnection layer 106, the covalent bonds and highly ordered ring structure in the COF layers enables high thermal conductivities and high mechanical strengths. Furthermore, due to the arrangement of the dielectric layers 106A made of the second COF material CFL2 interposed between the dielectric layers 106A made of the first COF material CFL1, the thermal conductivities and mechanical strengths can be further improved as compared with the use of the first COF material CFL1 alone. Overall, the heat dissipation efficiency and the parasitic capacitance of the semiconductor device 100E can be further improved to fulfill the needs of BEOL performance and reliability requirement in the advanced node.

Figure 7:
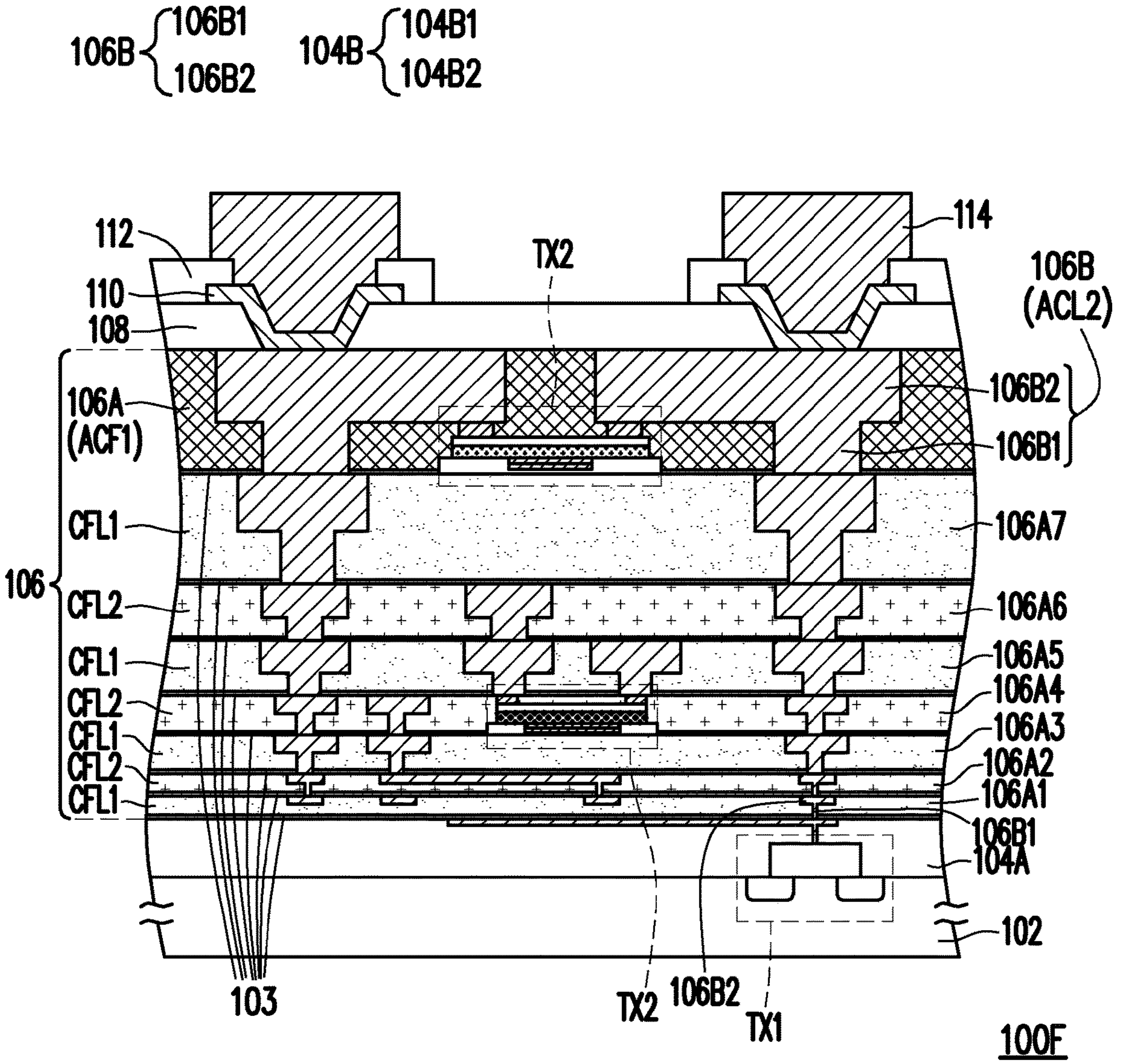
FIG. 7 is a schematic cross-sectional view of a semiconductor device in accordance with some other embodiments of the disclosure.

FIG. 7 is a schematic cross-sectional view of a semiconductor device in accordance with some other embodiments of the disclosure. The semiconductor device 100F shown in FIG. 7 is similar to the semiconductor device 100E shown in FIG. 6. Therefore, the same reference numerals are used to refer to the same or liked parts, and its detailed description will be omitted herein. The difference between the embodiments is that an auxiliary metal organic framework (MOF) layer ACF1 is further included.

As illustrated in FIG. 7, a topmost dielectric layer 106A in the interconnection layer 106 is an auxiliary metal organic framework (MOF) layer ACF1, whereby an auxiliary conductive layer ACL2 (including the conductive layer 106B) is embedded in the auxiliary MOF layer ACF1. In the exemplary embodiment, the auxiliary MOF layer ACF1 is for example, MOF-5, MOF-119, UIO-66, or the like. The auxiliary MOF layer ACF1 has a dielectric constant (k value) of 2 or less. However, the auxiliary MOF layer ACF1 has lower mechanical strength and lower thermal conductivities than the first COF material CFL1 and the second COF material CFL2. In other words, the formation of covalent bond frameworks provides higher mechanical strength and thermal conductivities. As such, if an auxiliary MOF layer ACF1 is included, the number of auxiliary MOF layers ACF1 should be less than the number of the dielectric layers 106A made of the first COF material CFL1 or the second COF material CFL2.

Similar to the above embodiments, in the semiconductor device 100F, since the first COF material CFL1 (with two-dimensional building block) and the second COF material CFL2 (with three-dimensional building block) are used in replacement of the conventional low-k dielectric materials (typically with dielectric constant of ~3 and thermal conductivity of <1 W/(m·K)) in the interconnection layer 106, the covalent bonds and highly ordered ring structure in the COF layers enables high thermal conductivities and high mechanical strengths. Furthermore, due to the arrangement of the dielectric layers 106A made of the second COF material CFL2 interposed between the dielectric layers 106A made of the first COF material CFL1, the thermal conductivities and mechanical strengths can be further improved as compared with the use of the first COF material CFL1 alone. Overall, the heat dissipation efficiency and the parasitic capacitance of the semiconductor device 100F can be further improved to fulfill the needs of BEOL performance and reliability requirement in the advanced node.

In the above-mentioned embodiments, the semiconductor device includes an interconnection layer having dielectric layers that are porous organic framework (POF) dielectrics having a dielectric constant of 2 or less, and a thermal conductivity of 1 W/(m·K) or more. As such, the thermal conductivities and mechanical strengths of the BEOL dielectrics can be further improved as compared with conventional low-k materials, which suffers from low mechanical strength issues and low thermal conductivity issues leading to degradation of device performance. Overall, the heat dissipation efficiency and the parasitic capacitance of the semiconductor device can be further improved to fulfill the needs of BEOL performance and reliability requirement in the advanced node.

In accordance with some embodiments of the present disclosure, a semiconductor device includes a substrate and an interconnection layer disposed on the substrate. The interconnection layer includes a plurality of etch-stop layers, a plurality of first dielectric layers, and a plurality of conductive layers. The first dielectric layers are disposed on the plurality of etch-stop layers, wherein the plurality of first dielectric layers comprises porous organic framework (POF) dielectrics having a dielectric constant of 2 or less, and a thermal conductivity of 1 W/(m·K) or more. The conductive layers are embedded in the first dielectric layers.

In accordance with some other embodiments of the present disclosure, the semiconductor device includes a substrate, an interconnection layer disposed on the substrate, a passivation layer disposed on the interconnection layer, and conductive terminals disposed on the passivation layer and electrically connected to the interconnection layer. The interconnection layer includes a first covalent organic framework (COF) layer, a first conductive layer, a second COF layer and a second conductive layer. The first COF layer is disposed on the substrate. The first conductive layer is surrounded by the first COF layer. The second COF layer is disposed on the first COF layer, wherein a thermal conductivity of the second COF layer is higher than the first COF layer. The second conductive layer is surrounded by the second COF layer.

In accordance with yet another embodiment of the present disclosure, a method of fabricating a semiconductor device is described. The method includes the following steps. A substrate is provided. An interconnection layer is formed on the substrate. The formation of interconnection layer includes: forming a first covalent organic framework (COF) layer on the substrate; patterning the first COF layer to form a first opening, and forming a first conductive layer in the first opening so that it is surrounded by the first COF layer; forming a second COF layer on the first COF layer, wherein a thermal conductivity of the second COF layer is higher than the first COF layer; and patterning the second COF layer to form a second opening, and forming a second conductive layer in the second opening so that it is surrounded by the second COF layer. A passivation layer is formed on the interconnection layer, and conductive terminals are formed on the passivation layer and electrically connected to the interconnection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

an interconnection layer disposed on the substrate, wherein the interconnection layer comprises:

a plurality of etch-stop layers;

a plurality of first dielectric layers disposed on the plurality of etch-stop layers, wherein the plurality of first dielectric layers comprises porous organic framework (POF) dielectrics having a dielectric constant of 2 or less, and a thermal conductivity of 1 W/(m·K) or more;

a plurality of second dielectric layers disposed on the plurality of etch-stop layers, wherein the plurality of second dielectric layers comprises porous organic framework (POF) dielectrics having a dielectric constant of 2 or less, and a thermal conductivity of 1 W/(m·K) or more, and the plurality of second dielectric layers is different from a material of the plurality of first dielectric layers; and a plurality of conductive layers embedded in the plurality of first dielectric layers.

2. The semiconductor device according to claim 1, wherein the POF dielectrics comprises a two-dimensional covalent organic framework (COF) or a three-dimensional COF.

3. The semiconductor device according to claim 2, wherein the two-dimensional COF is formed by a reaction between a first compound having a partial structure represented by formula IA and a second compound having a partial structure represented by formula IB to form a boronic ester, and the three-dimensional COF is formed by a reaction between a third compound having a partial structure represented by formula IIA and a fourth compound having a partial structure represented by formula IIB to form an imine:

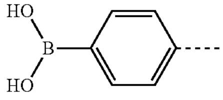

formula IA

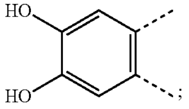

formula IB

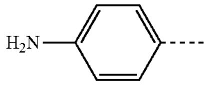

formula IIA

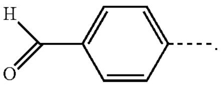

formula IIB

4. The semiconductor device according to claim 3, wherein the second compound is hexahydroxytriphenylene (HHTP), and the first compound is a compound having a structure represented by formula IA-X:

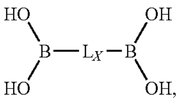

formula IA-X wherein in formula IA-X, $L_x$ is a linker selected from the group consisting of L1 to L5:

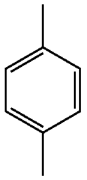

L1

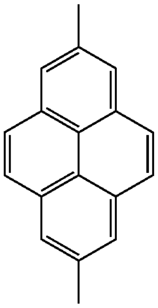

L2

-continued

L3

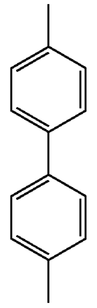

L4

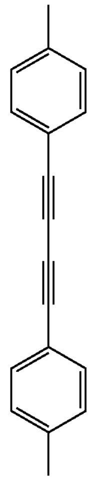

L5

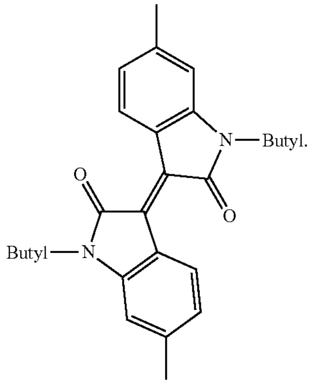

5. The semiconductor device according to claim 3, wherein the third compound is tetrakis (4-aminophenyl) methane (TAM), and the fourth compound is benzene-1,4-dicarbaldehyde (BDA).

6. The semiconductor device according to claim 1, further comprising a two-dimensional material layer located in between one of the plurality of etch-stop layers and one of the plurality of first dielectric layers.

7. The semiconductor device according to claim 1, wherein the plurality of first dielectric layers is silicon-free.

8. The semiconductor device according to claim 1, wherein the plurality of second dielectric layers has a higher thermal conductivity and a higher Young's modulus than the plurality of first dielectric layers.

9. A semiconductor device, comprising:

a substrate;

an interconnection layer disposed on the substrate, wherein the interconnection layer comprises:

a first covalent organic framework (COF) layer disposed on the substrate;

a first conductive layer surrounded by the first COF layer;

a second COF layer disposed on the first COF layer, wherein a thermal conductivity of the second COF layer is higher than the first COF layer; and a second conductive layer surrounded by the second COF layer;

a passivation layer disposed on the interconnection layer; and conductive terminals disposed on the passivation layer and electrically connected to the interconnection layer.

10. The semiconductor device according to claim 9, wherein the interconnection layer further comprises:

a first etch-stop layer located below the first COF layer and surrounding the first conductive layer; and a second etch-stop layer located in between the first COF layer and the second COF layer, and surrounding the second conductive layer.

11. The semiconductor device according to claim 9, wherein the interconnection layer further comprises:

a two-dimensional material layer located below the first COF layer, wherein the two-dimensional material layer is surrounding the first conductive layer, and a thickness of the two-dimensional material layer is smaller than a thickness of the first COF layer.

12. The semiconductor device according to claim 9, wherein the interconnection layer further comprises:

a third COF layer disposed on the second COF layer, wherein a thermal conductivity of the third COF layer is lower than the second COF layer; and a third conductive layer surrounded by the third COF layer.

13. The semiconductor device according to claim 9, wherein a Young's modulus of the first COF layer and the second COF layer is 55 GPa or more.

14. The semiconductor device according to claim 9, wherein the first COF layer is a two-dimensional COF layer, and the second COF layer is a three-dimensional COF layer.

15. The semiconductor device according to claim 9, wherein the interconnection layer further comprises:

an auxiliary metal organic framework (MOF) layer disposed on the first COF layer and the second COF layer; and an auxiliary conductive layer surrounded by the auxiliary MOF layer, wherein the auxiliary conductive layer is electrically connected to the first conductive layer and the second conductive layer.

16. A method of fabricating a semiconductor device, comprising:

providing a substrate;

forming an interconnection layer on the substrate, wherein forming the interconnection layer comprises:

forming a first covalent organic framework (COF) layer on the substrate;

patterning the first COF layer to form a first opening, and forming a first conductive layer in the first opening so that it is surrounded by the first COF layer;

forming a second COF layer on the first COF layer, wherein a thermal conductivity of the second COF layer is higher than the first COF layer; and patterning the second COF layer to form a second opening, and forming a second conductive layer in the second opening so that it is surrounded by the second COF layer;

forming a passivation layer on the interconnection layer; and forming conductive terminals on the passivation layer and electrically connected to the interconnection layer.

17. The method according to claim 16, wherein the first COF layer and the second COF layer are patterned by an ashing process using $N_2/H_2$ plasma at a temperature range from 150° C. to 250° C.

18. The method according to claim 16, wherein forming the interconnection layer further comprises:

forming a first etch-stop layer prior to forming the first COF layer, and forming the first COF layer on the first etch-stop layer; and forming a second etch-stop layer prior to forming the second COF layer, and forming the second COF layer on the second etch-stop layer.

19. The method according to claim 16, wherein forming the interconnection layer further comprises:

forming a two-dimensional material layer on the substrate prior to forming the first COF layer, wherein after forming the first COF layer and the first conductive layer, the two-dimensional material layer is surrounding the first conductive layer, and a thickness of the two-dimensional material layer is smaller than a thickness of the first COF layer.

20. The method according to claim 16, wherein forming the interconnection layer further comprises:

forming a third COF layer on the second COF layer, wherein a thermal conductivity of the third COF layer is lower than the second COF layer; and patterning the third COF layer to form a third opening, and forming a third conductive layer in the third opening so that it is surrounded by the third COF layer.

* * * * *